(12) United States Patent
Kim et al.

(10) Patent No.: US 11,552,246 B2
(45) Date of Patent: Jan. 10, 2023

(54) MEMRISTORS AND RELATED SYSTEMS AND METHODS

(71) Applicant: Massachusetts Institute of Technology, Cambridge, MA (US)

(72) Inventors: Jeehwan Kim, Cambridge, MA (US); Hanwool Yeun, Cambridge, MA (US); Scott Tan, Cambridge, MA (US); Peng Lin, Cambridge, MA (US); Yongmo Park, Ann Arbor, MI (US); Chanyeol Choi, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 17/153,744

(22) Filed: Jan. 20, 2021

(65) Prior Publication Data

US 2021/0226122 A1    Jul. 22, 2021

Related U.S. Application Data

(60) Provisional application No. 63/066,344, filed on Aug. 17, 2020, provisional application No. 62/964,003, filed on Jan. 21, 2020.

(51) Int. Cl.
*H01L 45/00* (2006.01)
*H01L 27/24* (2006.01)

(52) U.S. Cl.
CPC ...... *H01L 45/1253* (2013.01); *H01L 27/2418* (2013.01); *H01L 27/2481* (2013.01); *H01L 45/14* (2013.01); *H01L 45/1641* (2013.01)

(58) Field of Classification Search
CPC ............. H01L 45/1253; H01L 27/2418; H01L 27/2481; H01L 45/14; H01L 45/1641; H01L 27/249; H01L 45/085; H01L 45/1233; H01L 45/1266; H01L 45/148
See application file for complete search history.

(56) References Cited

U.S. PATENT DOCUMENTS

| | | | |
|---|---|---|---|
| 4,010,482 A | 3/1977 | Abbas et al. | |
| 4,503,521 A | 3/1985 | Schick et al. | |
| 8,450,711 B2 | 5/2013 | Williams et al. | |
| 9,224,951 B1 | 12/2015 | Wang et al. | |
| 9,793,473 B2 | 10/2017 | Wang et al. | |
| 10,115,894 B2 | 10/2018 | Kim et al. | |
| 10,164,179 B2 | 12/2018 | Brew et al. | |
| 10,756,263 B2 * | 8/2020 | Appenzeller | G11C 13/0069 |
| 10,892,407 B2 | 1/2021 | Kim et al. | |

(Continued)

FOREIGN PATENT DOCUMENTS

| | | |
|---|---|---|
| WO | WO 2017/222592 A1 | 12/2017 |
| WO | WO 2018/125519 A1 | 7/2018 |
| WO | WO 2020/072885 A1 | 4/2020 |

OTHER PUBLICATIONS

Choi et al., SiGe epitaxial memory for neuromorphic computing with reproducible high performance based on engineered dislocations. Nat Mater. 2018;17:335-40.

(Continued)

*Primary Examiner* — David Vu
(74) *Attorney, Agent, or Firm* — Wolf, Greenfield & Sacks, P.C.

(57) ABSTRACT

Memristors, including memristors comprising a Schottky barrier, and related systems and methods are generally described.

26 Claims, 34 Drawing Sheets

(56) References Cited

U.S. PATENT DOCUMENTS

| | | |
|---|---|---|
| 2005/0226067 A1 | 10/2005 | Herner et al. |
| 2006/0221555 A1 | 10/2006 | Pinnow |
| 2007/0029538 A1 | 2/2007 | Pinnow |
| 2008/0274585 A1 | 11/2008 | Lung et al. |
| 2012/0008366 A1 | 1/2012 | Lu |
| 2012/0043519 A1 | 2/2012 | Jo et al. |
| 2012/0074372 A1 | 3/2012 | Yang et al. |
| 2013/0062587 A1 | 3/2013 | Lee et al. |
| 2013/0277638 A1 | 10/2013 | Moradpour et al. |
| 2014/0175362 A1 | 6/2014 | Tendulkar et al. |
| 2014/0264238 A1 | 9/2014 | Jo |
| 2014/0301138 A1 | 10/2014 | Mani |
| 2015/0035098 A1 | 2/2015 | Mani |
| 2015/0078065 A1 | 3/2015 | Vianello et al. |
| 2015/0357566 A1 | 12/2015 | Wang et al. |
| 2017/0317141 A1 | 11/2017 | Bedau |
| 2017/0365778 A1 | 12/2017 | Kim et al. |

OTHER PUBLICATIONS

Jo et al., Nanoscale memristor device as synapse in neuromorphic systems. Nano Lett. Apr. 14, 2010;10(4):1297-301. doi: 10.1021/nl904092h.

Kim et al., Tuning resistive switching characteristics of tantalum oxide memristors through Si doping. ACS Nano. Oct. 28, 2014;8(10):10262-9. doi: 10.1021/nn503464q. Epub Sep. 29, 2014.

Liu et al., Percolation network in resistive switching devices with the structure of silver/amorphous silicon/p-type silicon. Appl Phys Lett. 2014;104:043502(1-4).

Manoj et al., Aqueous electrolyte system for porous silicon using electrochemical anodization. 2013 IEEE Intl Conf Electro/Information Technol (EIT). May 2013. doi: 10.1109/385.2013/6632656. 4 pages.

Pan et al., Recent progress in resistive random access memories: Materials, switching mechanisms, and performance. Mater Sci Eng R Rpts. Sep. 2014;83(1):1-59.

Scheeler et al., Fabrication of porous silicon by metal-assisted etching using highly ordered gold nanoparticle arrays. Nanoscale Res Lett. Aug. 9, 2012;7(1):450. doi: 10.1186/1556-276X-7-450.

Szot et al., Switching the electrical resistance of individual dislocations in single-crystalline SrTiO3. Nat Mater. Apr. 2006;5:312-29. doi: 10.1038/nmat1614. Epub Mar. 26, 2006.

Valov et al., Electrochemical metallization memories—fundamentals, applications, prospects. Nanotechnol. Jun. 2011;22(25):254003. Epub May 16, 2011.

Wang et al., Engineering incremental resistive switching in TaOx based memristors for brain-inspired computing. Nanoscale. Aug. 7, 2016;8(29):14015-22. doi: 10.1039/c6nr00476h. Epub May 4, 2016.

\* cited by examiner

MEMRISTORS AND RELATED SYSTEMS AND METHODS

RELATED APPLICATIONS

This application claims priority under 35 U.S.C. § 119(e) to U.S. Provisional application No. 63/066,344, filed Aug. 17, 2020, and entitled "Memristors and Related Systems and Methods," and to U.S. Provisional Application No. 62/964,003, filed Jan. 21, 2020, and entitled "Memristors and Related Systems and Methods," each of which is incorporated herein by reference in its entirety for all purposes.

TECHNICAL FIELD

Memristors, including memristors comprising a Schottky barrier, and related systems and methods are generally described.

BACKGROUND

The current state-of-the-art in nonvolatile memory is primarily centered around silicon-based flash memory due to its high density and low cost. However, flash memories have several disadvantages, such as slow operation speed (e.g., write/erase times of about 1 ms/0.1 ms), poor endurance (e.g., about $10^6$ write/erase cycles), and high write voltage (e.g., greater than 10 V). Moreover, flash memories may reach the miniaturization limit in the near future due to large leakage currents.

One technology that may overcome the disadvantages of flash memories is resistive random access memory (RRAM). The underlying physical mechanism of RRAM is usually resistive switching (RS), which allows the cell to be freely programmed into a high resistance state (HRS, or OFF state) or a low resistance state (LRS, or ON state) under an external electrical bias. In most cases, current flows uniformly through the device in the HRS and is restricted to a local region with high conductance known as a conducting filament (CF) in the LRS. The simple structure of RRAM enables easy integration in passive crossbar arrays with a small size of $4F^2$ (F is the minimum feature size). The size can be further reduced to $4F^2/n$ within vertically stacked three-dimensional (3-D) architectures (n is the stacking layer number of the crossbar array).

However, RRAMs have their own limitations. For example, current RRAMs typically use amorphous materials as the switching medium disposed between electrodes. During switching events, conductive filaments can be formed anywhere within the amorphous material. As a result, it can be difficult to accurately locate or confine the conductive filament. In addition, the random formation of conductive filaments in RRAMs can also reduce the uniformity (and increase the variance) of performance among different cells. The increased individual variability of RRAM cells can in turn limit widespread applications.

SUMMARY

The present disclosure relates to memristors and associated devices and methods. In certain embodiments, the memristor comprises a crystalline layer, a first electrode proximate to the crystalline layer comprising an active material, and a second electrode, which is also proximate to the crystalline layer. In some embodiments, upon applying a voltage across the first and second electrode, metallic species from the active material within the first electrode are transferred into the crystalline layer such that the resistance of the crystalline layer is altered (e.g., increased, decreased). In this way, the resistance may be modified into distinct "ON" and "OFF" states to function as an electrical switch, in accordance with certain embodiments. Transfer of the metallic species into (and/or out of) the crystalline layer can be done such that a conductive metal filament is not created within the crystalline layer, but rather, a percolation network is created within the crystalline layer. For example, in some embodiments, the metallic species occupy interstices of the crystal lattice of the crystalline layer. In some embodiments, the crystalline layer is a single crystalline layer. In certain embodiments, the crystalline layer is a polycrystalline layer comprising passivated grain boundaries.

The subject matter of the present invention involves, in some cases, interrelated products, alternative solutions to a particular problem, and/or a plurality of different uses of one or more systems and/or articles.

In one aspect, a device for electrical switching is described. In some embodiments, the device for electrical switching comprises a crystalline layer, a first electrode disposed proximate to the crystalline layer, and a second electrode disposed proximate to the crystalline layer, wherein the first electrode comprises an active material from which at least one metallic species is transferred into interstices of a crystal lattice of the crystalline layer upon application of a first voltage across the first electrode and the second electrode, such that the resistance of the crystalline layer is altered.

In some embodiments, a device for electrical switching comprises a single crystalline layer; a first electrode disposed proximate to the single crystalline layer; and a second electrode disposed proximate to the single crystalline layer, wherein the first electrode comprises a material from which at least one metallic species is transferred into the single crystalline layer upon application of a first voltage across the first electrode and the second electrode, such that the resistance of the single crystalline layer is altered.

In certain embodiments, a device for electrical switching comprises a polycrystalline layer comprising passivated grain boundaries; a first electrode disposed proximate to the polycrystalline layer; and a second electrode disposed proximate to the polycrystalline layer, wherein the first electrode comprises a material from which at least one metallic species is transferred into the polycrystalline layer upon application of a first voltage across the first electrode and the second electrode, such that the resistance of the polycrystalline layer is altered.

Methods of actuating devices comprising crystalline layers are also described herein. In some embodiments, a method of actuating a device comprising a crystalline layer, a first electrode comprising an active material, and a second electrode comprises applying a first voltage, having a first sign, across the first electrode and the second electrode, the first voltage causing a plurality of metallic species of the active material to be transferred into interstices of a crystal lattice of the crystalline layer, such that a resistance of the crystalline layer is altered.

In some embodiments, a method of actuating a device comprising a single crystalline layer, a first electrode comprising a material, and a second electrode comprises applying a first voltage, having a first sign, across the first electrode and the second electrode, the first voltage causing a plurality of metallic species of the material to be transferred into the single crystalline layer, such that a resistance of the single crystalline layer is altered.

In certain embodiments, a method of actuating a device comprising a polycrystalline layer comprising passivated grain boundaries, a first electrode comprising a material, and a second electrode comprises applying a first voltage, having a first sign, across the first electrode and the second electrode, the first voltage causing a plurality of metallic species of the material to be transferred into the polycrystalline layer, such that a resistance of the polycrystalline layer is altered.

In one aspect, a method of fabricating an electrical switching device is provided. In some embodiments, the method of fabricating an electrical switching device comprises arranging a crystalline layer, a first electrode, and a second electrode such that the first electrode is disposed proximate to the crystalline layer and the second electrode is disposed proximate to the crystalline layer, wherein the first electrode comprises an active material from which at least one metallic species is transferred into interstices of a crystal lattice of the crystalline layer upon application of a first voltage across the first electrode and the second electrode, such that the resistance of the crystalline layer is altered.

In some embodiments, a method of fabricating an electrical switching device comprises arranging a single crystalline layer, a first electrode, and a second electrode such that the first electrode is disposed proximate to the single crystalline layer and the second electrode is disposed proximate to the single crystalline layer, wherein the first electrode comprises a material from which at least one metallic species is transferred into the single crystalline layer upon application of a first voltage across the first electrode and the second electrode, such that the resistance of the single crystalline layer is altered.

In certain embodiments, a method of fabricating an electrical switching device comprises arranging a single crystalline layer, a first electrode, and a second electrode such that the first electrode is disposed proximate to the single crystalline layer and the second electrode is disposed proximate to the single crystalline layer, wherein the first electrode comprises a material from which at least one metallic species is transferred into the single crystalline layer upon application of a first voltage across the first electrode and the second electrode, such that the resistance of the single crystalline layer is altered.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Embodiments related to electrical switching comprising dispersing metallic species into a crystalline layer to alter the electrical resistance of the crystalline layer, related devices (e.g. memristors), and methods, are generally disclosed.

In one aspect, a device for electrical switching is described. The device comprises, in certain embodiments, a crystalline layer, a first electrode, and a second electrode proximate to the crystalline layer. The first electrode comprises, in accordance with certain embodiments, an active material from which, upon application of a first voltage across the two electrodes, at least one metallic species may be transferred into the crystalline layer (e.g., into the interstices of the crystal lattice of the crystalline layer). In doing so, the resistance of the crystalline layer can be altered, which can be used to effect electrical switching.

In another aspect, a method of actuating a device comprising a crystalline layer, a first electrode comprising an active material, and a second electrode is described. The method comprises, in accordance with some embodiments, applying a first voltage having a first sign across the first and the second electrode. The applied voltages causes, in certain embodiments, a plurality of metallic species of the active material to be transferred into the crystalline layer (e.g., into interstices of a crystal lattice of the crystalline layer) such that the resistance of the crystalline layer is altered.

In yet another aspect, a method of fabricating an electrical switching device is described. The method comprises, in some embodiments, arranging a crystalline layer, a first electrode, and a second electrode such that the two electrodes are disposed proximate to the crystalline layer. The first electrode comprises, in certain embodiments, an active material from which, upon application of a first voltage across the first electrode and second electrode, at least one metallic species is transferred from the first electrode into the crystalline layer (e.g., into the interstices of a crystal lattice of the crystalline layer). Upon application of the voltage, in accordance with certain embodiments, the resistance of the crystalline layer is altered.

FIGS. 1A-1F are cross-sectional schematic illustrations of an exemplary switching device, in accordance with certain embodiments. As described elsewhere herein, the device can be a "memristor." That is to say, the device can be operated such that an application of voltages causes a hysteresis effect with respect to the resistivity of a material (e.g., a crystalline material) within the device.

Figure 1A:
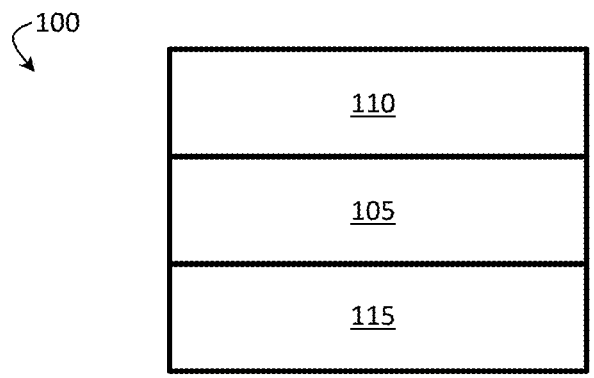
FIGS. 1A-1F are schematic cross-sectional illustrations of a device for electrical switching, in accordance with certain embodiments.
Figure 1B:
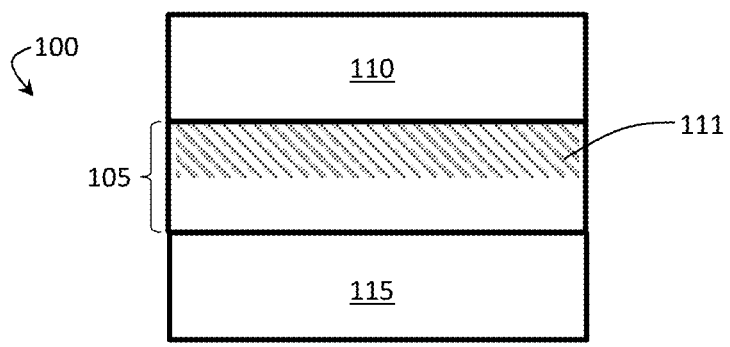

Referring to FIG. 1A as a non-limiting example, device for electrical switching 100 comprises a crystalline layer 105 proximate to first electrode 110. In FIG. 1A, crystalline layer 105 is also proximate to second electrode 115. In some embodiments, when first electrode 110 is placed proximate to crystalline layer 105, a depletion zone 111 may form between first electrode 110 and crystalline layer 105, as illustrated in FIG. 1B. Depletion zone 111 may be at least in partially embedded within crystalline layer 105, as illustrated in FIG. 1B. In accordance with certain embodiments, upon application of a first voltage (e.g., first voltage 130 shown in FIG. 1C), metallic species 125 move from an active material of first electrode 110 into depletion zone 111 and may penetrate crystalline layer 105. When metallic species 125 migrates into crystalline layer 105, the resistance of at least a portion of crystalline layer 105 may be modified or altered (e.g., increased, decreased).

Figure 1C:
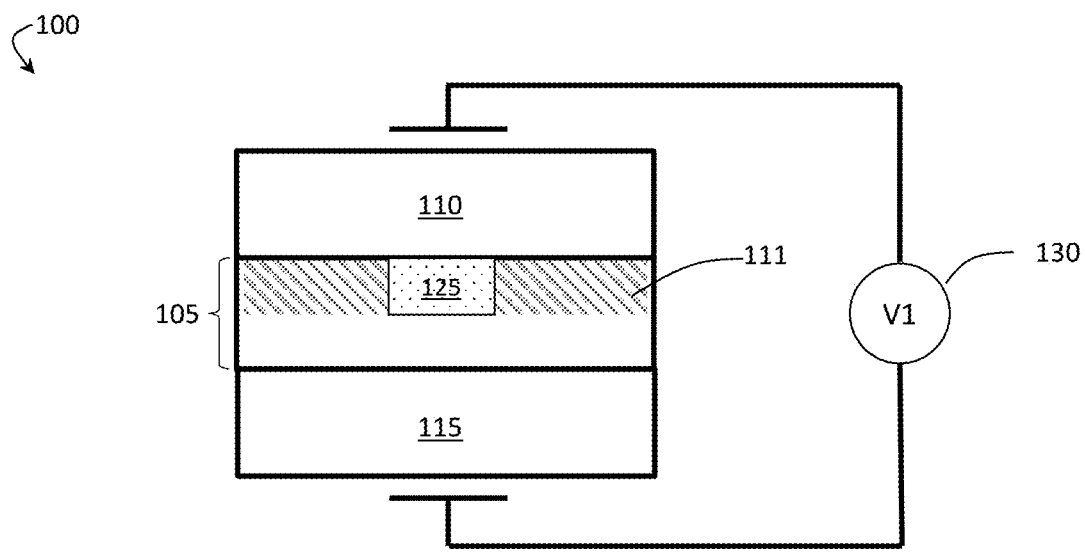
Figure 1D:
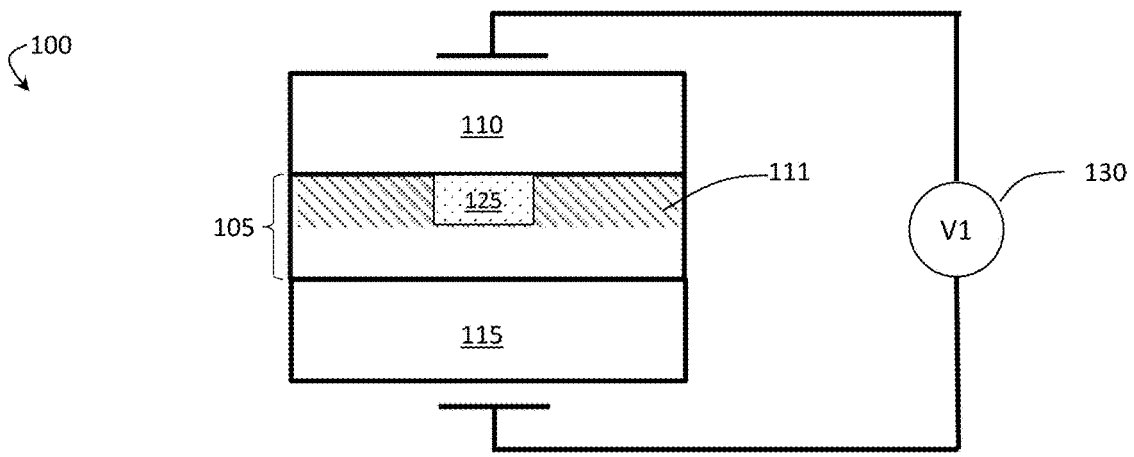
Figure 1E:
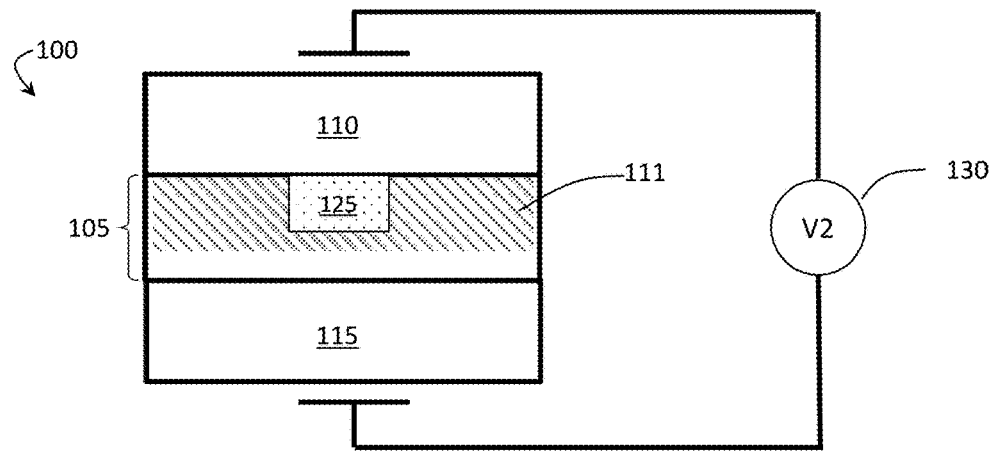
Figure 1F:
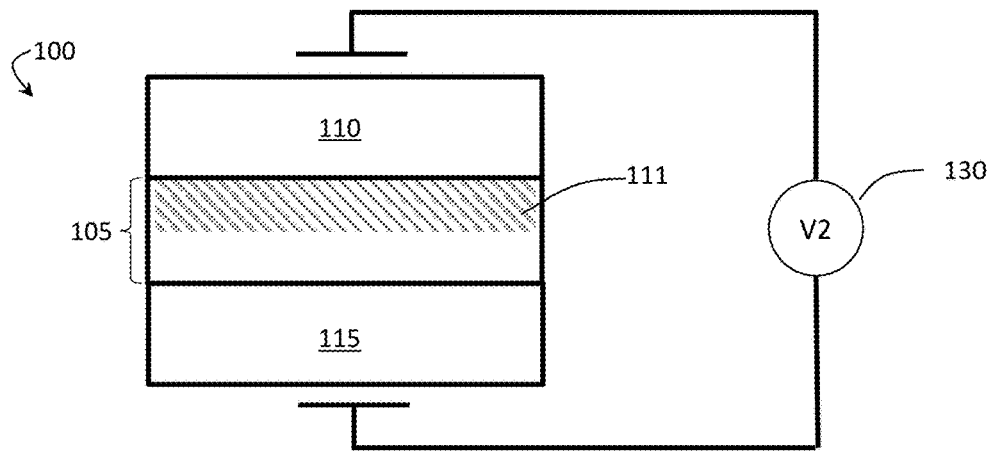

While FIGS. 1A-1C show first electrode 110 and second electrode 115 being on opposite sides of crystalline layer 105, other arrangements are also possible. For example, in some embodiments, the first electrode and the second electrode can be on the same side of the crystalline layer.

In certain embodiments, the metallic species can migrate into the crystalline layer such that a percolating conductive pathway is formed between the first electrode and the second electrode. For example, in FIG. 1D, the application of voltage V1 has resulted in the movement of metallic species 125 into depletion zone 111 such that a percolating conductive network has been formed between first electrode 110 and second electrode 115.

According to certain embodiments, upon removal of the first voltage applied between the first electrode and the second electrode, the percolating conductive network can remain within the crystalline layer and/or the depletion zone. This can allow, therefore, memory made of one or more devices 100 to be nonvolatile. For example, in some embodiments, upon removing the power supply of a memory made using one or more device 100, the stored information (e.g., 0 or 1) in the form of the switching state of each device 100 (e.g., "ON" or "OFF") remains in the memory. In other words, in some embodiments, the memory does not erase data stored in memory when power is removed from the memory (e.g., upon a power outage or upon otherwise disconnecting power).

In some embodiments, upon applying a second voltage (which may have the opposite polarity (also referred to as having the opposite sign) as the first voltage), metallic species 125 leave crystalline layer 105 or depletion zone 111. As metallic species 125 leave crystalline layer 105, the percolating network between the first and second electrodes can be removed. For example, in FIG. 1E, voltage V2 has been applied such that metallic species 125 no longer forms a percolating network between first electrode 110 and second electrode 115.

In some embodiments, applying the second voltage results in the return of the resistance of crystalline layer to its initial state or in a change of the resistance of the crystalline layer to a value different from the initial state. For example, in FIG. 1F, second voltage V2 has been applied such that metallic species 125 have returned to first electrode 110 and the resistance of crystalline layer 105 is at or near (e.g., within 5%, within 2%, or within 1%) of its original resistance prior to the application of the first voltage. However, depletion zone 111 may remain between or partially embedded in crystalline layer 105 and/or first electrode 110.

This process of applying first and second voltages (and establishing and removing the percolating network) may be repeated multiple times (e.g. at least 10 times, at least 100 times, at least 1000 times, at least $10^5$ times, at least $10^6$ times, at least $10^8$ times, at least $10^{10}$ times, or more) so that the switch may return from "ON" to "OFF" for one or multiple cycles.

In some embodiments, devices and methods described herein may be used as electronic switching elements. Such devices may be actuated between open and closed switch positions, in certain embodiments, by applying a relatively low voltage between electrodes. In some embodiments, when in a closed switch position, electrons may flow from one electrode to another via a tunneling phenomenon, rather than through direct electronic contact between electrodes (which might be established, for example, in other devices that are not the subject of this disclosure, in which continuous conductive filaments are established between the electrodes). Such devices, in accordance with certain embodiments, may also exhibit a relatively low leakage current, if any, when placed in the open switch position. For example, devices in accordance with the present disclosure may include at least one electrode proximate to a crystalline layer, and the device may be actuated between respective open and closed switch positions. When in an open switch position ("OFF" state), the components of the device or devices made according to some methods may have a high resistance such that little to no current flows between the electrodes. When in a closed switch position ("ON" state), the electrodes may have sufficiently low electrical resistance between them so that a suitable current (e.g., tunneling current) flows. In some embodiments, upon suitable release of the actuation voltage and/or force, the crystalline layer may provide an inherent resistance so as to return the device back to an "OFF" state. In certain embodiments, the resistance of the crystalline layer absent an applied voltage may vary from the inherent resistance of the crystalline layer absent one or more metallic species.

Figure 2A:
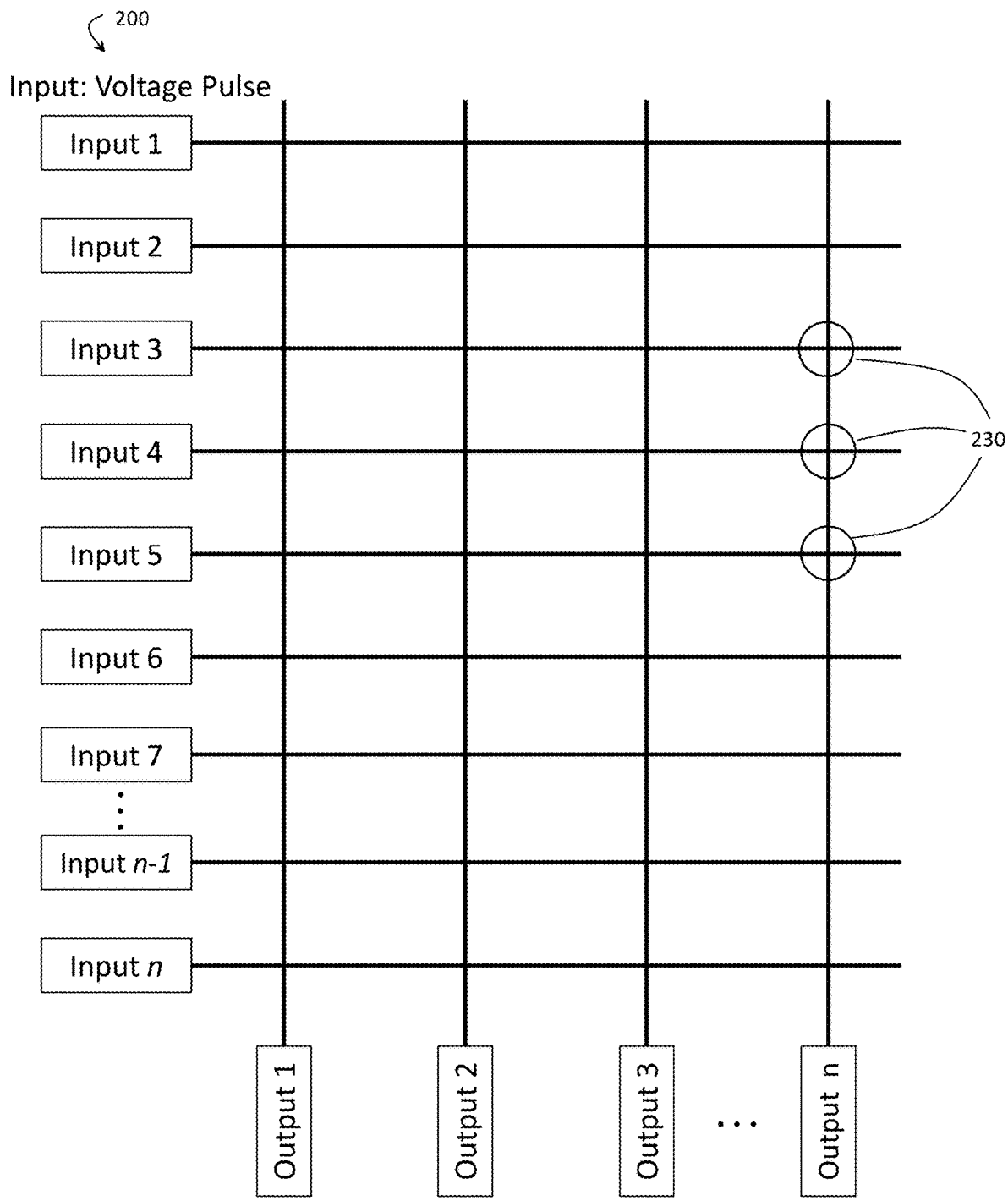
FIGS. 2A-2B are schematic illustrations of exemplary devices for electrical switching fabricated into an array of switching devices, according to some embodiments.
Figure 2B:
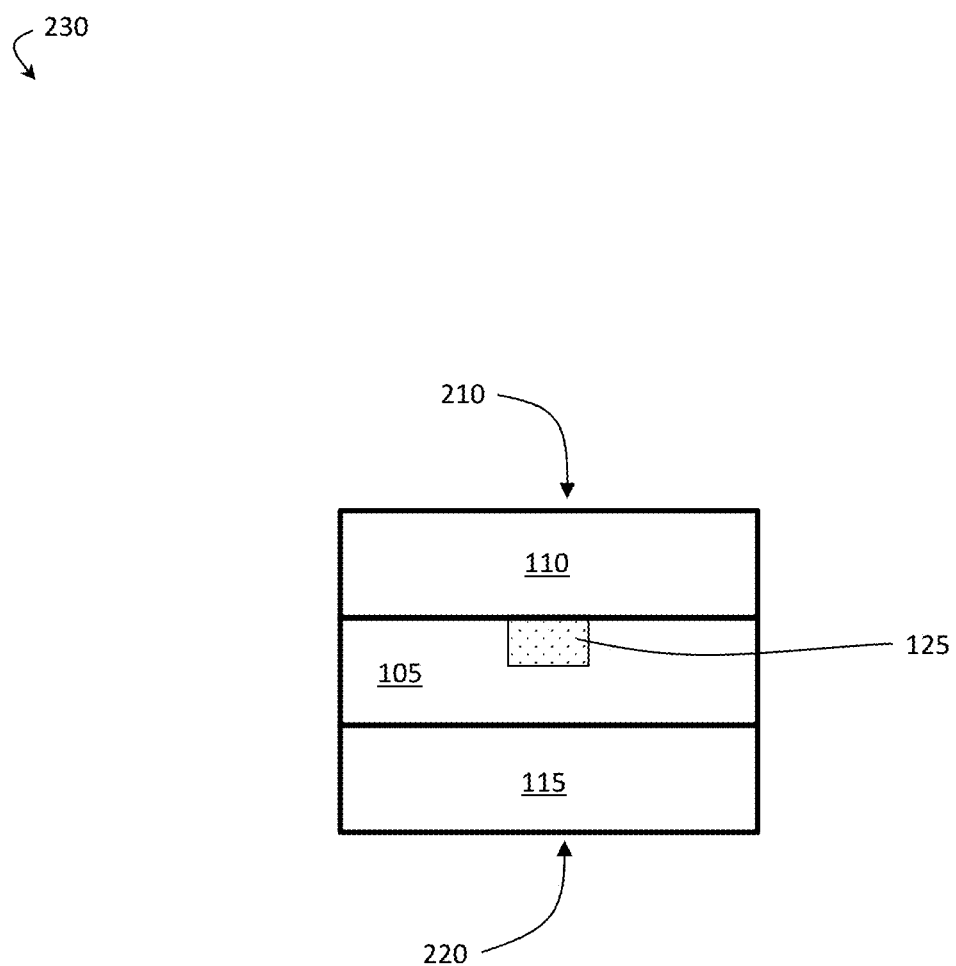

Certain embodiments of the electrical switching device may be fabricated into an array of electrical switching devices, for example, to use as part of an electronic memory device. One such embodiment is shown in FIG. 2A, which is a top-down schematic illustration of a memory device. In FIG. 2A, device 200 comprises an array of devices 230 (one example of which is shown in the cross-sectional schematic illustration of FIG. 2B). In accordance with some embodiments, each intersection of the lines shown in FIG. 2A can correspond to a device 230 (e.g., which can be similar to device 100 described above with respect to FIG. 1). Referring to FIG. 2B, in some embodiments, device 230 comprises surface 210 of first electrode 110. Device 230 further comprises surface 220 of second electrode 115. In some embodiments, surfaces 210 and 220 can be used as electrical contacts and can allow one to input a first voltage that causes an influx of metallic species into crystalline layer that alters the resistance of the device. The altered resistance may result in the switch being transformed from one of an "ON" state and "OFF" state to the other. By arranging a plurality of devices in an array, the array can be configured (and/or used) to store multiple bits of data.

As noted above, in some embodiments, a crystalline layer may be disposed between the electrodes. In some embodiments, the crystalline layer is free of metallic species prior to the application of the first voltage. The crystalline layer may, in some embodiments, be substantially free of electrically conductive material prior to first use. In some embodiments, the crystalline layer may prevent the first electrode and the second electrode from contacting each other.

Also as noted above, the first electrode may comprise an active material, in certain embodiments. As used herein, an "active material" is any material capable of being transferred from the first electrode into the interstices of the crystalline layer. In some embodiments, the active material is capable of being transferred from the first electrode into the interstices of a crystal lattice of the crystalline layer. This transfer may occur upon the application of an applied voltage across the first electrode and the crystalline layer or may occur spontaneously when the first electrode is proximate to the crystalline layer. Whether a material within the first electrode behaves as an "active material" will generally depend upon the composition and/or arrangement of the crystalline layer and the composition of the first electrode. As one non-limiting example, silver or a silver alloy (e.g., AgCu, or other silver alloys) may be present in the first electrode, and the crystalline layer may comprise silicon, in which case, the silver may be transported into the interstices of the crystalline layer after application of the first voltage. As another example, tellurium can be used as the active material. For example, tellurium (or a tellurium alloy) can be present in the first electrode, and the first crystalline layer may comprise silicon, in which case, the tellurium may be transported into the interstices of the crystalline layer after application of the first voltage. Other pairings of active materials and suitable crystalline layers are possible and will be apparent to those skilled in the art, as the disclosure is not so limited.

In some embodiments, upon application of an appropriate actuation potential difference (e.g., depending on the application, less than 10.0 V, less than 5.0 V, or less than 1.0 V) between electrodes, the device may change configuration from an open switch position to a closed switch position. For example, referring to FIG. 1C, in some embodiments, application of first voltage 130 can cause metallic species 125 to migrate from first electrode 110 to crystalline layer 105 to form a percolation network of metallic species within the crystal lattice of the crystalline layer that electrically couples first electrode 110 to second electrode 115. Formation of a percolation network of metallic species within the interstices of the crystal lattice of the crystalline layer alters the resistance of the device such that the state of the device (i.e., "ON" or "OFF") changes upon formation of the percolation network. In some embodiments, upon release of first voltage 130 or upon application of a second voltage, the metallic species may at least partially transfer back to the first electrode such that the device returns to its original state prior to the application of the first voltage.

In some embodiments, an optional layer may be disposed between the crystalline layer and the first electrode or the second electrode. In some embodiments, this layer is a blocking layer that may function to reduce bulk leakage current to the apparatus. The blocking layer may reduce the possibility of discharge between the first electrode and the second electrode, thereby reducing bulk leakage current from the device or systems comprised of devices described herein. In other embodiments, no blocking layer is present between the first electrode and the crystalline layer or between the second electrode and the crystalline layer. In some embodiments, the layer may be an insulator.

Figure 5A:
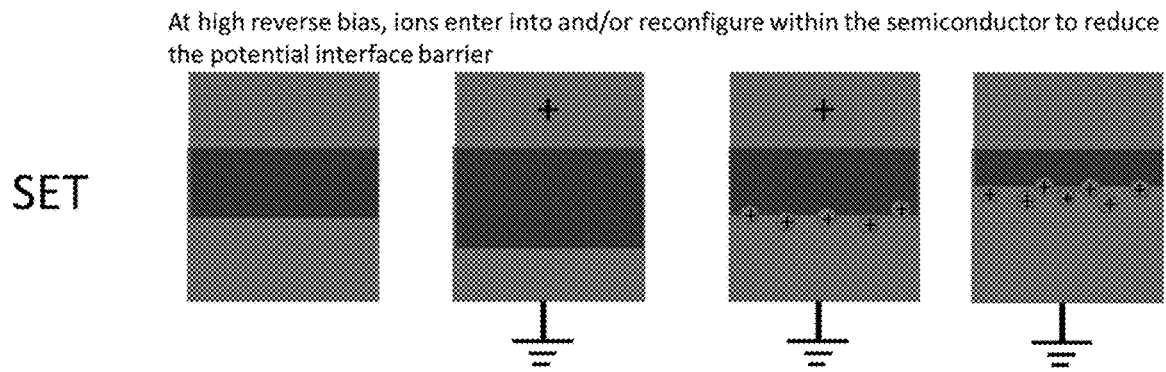
FIGS. 5A-5B show schematic illustrations of ions entering into and out of a semiconductor as a function of the applied bias, either at a high reverse bias or a high forward bias, according to one set of embodiments.
Figure 5B:
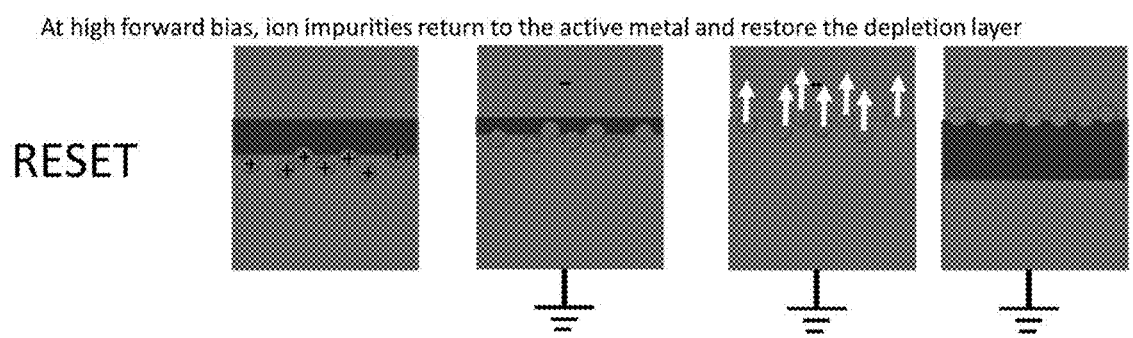

In some embodiments, the devices and methods described may be referred to as a "switch," for example, a device that functions as a switch that may be actuated between open and closed switch positions through transfer of metallic species into or out of the layer containing the active material or any transformation within the device that actuates the conductance and/or resistance. In some embodiments, the present disclosure provides for electrical devices with elements having nanoscale structural features, such as the formation of percolation network in the crystalline layer, that may be actuated repeatedly between "ON" and "OFF" states using relatively low voltages (e.g., less than 10.0 V or, in some cases, less than 1.0 V), for example, to create an electrical switching mechanism. Accordingly, such devices may be well suited for low power applications. For example, the "ON" state, in some embodiments, may be reached by the application of a voltage and the transfer of metallic species from the first electrode to the crystalline layer. A schematic illustration of this process can be seen in FIG. 5A. The transition from an "ON" to an "OFF" state may be achieved by applying an additional voltage such that metallic species are transferred from the crystalline layer to the first electrode. In some embodiments, the "OFF" state may be reached by the application of a voltage and the transfer of metallic species from the first electrode to the crystalline layer. The transition from an "OFF" to an "ON" state may be achieved by applying an additional voltage such that metallic species are transferred from the crystalline layer to the first electrode, for example, as depicted in FIG. 5B. Those skilled in the art will be able to select which "ON" or "OFF" state is appropriate for an intended application. Embodiments of the present disclosure may be suitable for a variety of different uses and implementations such as, for example, electronics products, medical applications, autonomous applications powered by energy harvesters, sensors, actuators, microphones, etc., and may include other applications.

In some embodiments, the voltage difference between electrodes that is sufficient to cause the electrodes to actuate to a closed switch position is less than 1.0 V, less than 0.8 V, less than 0.5 V, or less than 0.3 V. In some embodiments, the voltage difference between electrodes that is sufficient to cause the electrodes to actuate to a closed switch position is between 0.1 V and 1.0 V, between 0.1 V and 0.5 V, or between 0.1 V and 0.3 V. Such voltage differences that result in suitable actuation of the switch may be appropriate for CMOS applications, although devices in accordance with the present disclosure may be suitable for use in other applications. In some embodiments, the voltage difference between electrodes adequate to cause actuation to a closed switch position is less than 15.0 V, less than 12.0 V, less than 10.0 V, less than 8.0 V, less than 6.0 V, less than 4.0 V, or less than 2.0 V. In some embodiments, the voltage difference between electrodes adequate to cause actuation to a closed switch position is between 0.1 V and 10.0 V, between 0.5 V and 5.0 V, between 1.0 V and 5.0 V, or between 5.0 V and 10.0 V. It can be appreciated that a voltage difference appropriate to cause actuation of the electrodes may fall within ranges defined by any of the end points listed above, or may fall outside of the above-noted ranges.

In some embodiments, devices and methods described herein may be configured to be repeatedly actuated between open and closed switch positions (and vice versa), without degradation of the functioning of the device or electrical component. In this way, switching between "ON" and "OFF" positions may be performed at least 100 times, at least 1000 times, at least $10^5$ times, at least $10^6$ times, at least $10^8$ times, at least $10^{10}$ times, or more.

In some embodiments, applying a first voltage across the first electrode and the second electrode may cause metallic species (e.g., one or more metal atoms alone or in clustered form, ions, etc.) from active material to be transferred to the crystalline layer or a depletion zone such that the electrical resistance is altered. Referring back to FIG. 1C, after application of voltage 130, metallic species 125 have been transferred from first electrode 110 into the interstitial sites of the crystal lattice of crystalline layer 105 within depletion zone 111. In some embodiments, this transfer does not create a conductive filament in the crystalline layer, but rather forms a percolation network in the crystalline layer that alters the resistance. For example, referring to FIG. 1E, metallic species 125 may be arranged such that they do not form a continuous bridge of solid metallic material from first electrode 110 to second electrode 115, but they are arranged closely enough such that electrical current can be transported from first electrode 110 to second electrode 115 (via the electronic percolation network they have formed). Without wishing to be bound by any particular theory, electrical current may tunnel from the first electrode to the second electrode, despite the lack of a contact between the first electrode and the second electrode.

As stated previously, in some embodiments, the resistance of the crystalline layer is altered (e.g., a reduction of the resistance) when at least one metallic species is transferred into the crystalline layer. In some embodiments, the transfer of metallic species into the crystalline layer results in a reduction of the through-thickness resistance of the crystalline layer of at least 95%, at least 99%, at least 99.9%, at least 99.99%, at least 99.999%, or more. As would be understood by those of ordinary skill in the art, the reduction of the through-thickness resistance of the crystalline layer, in this context, is measured relative to the initial, higher through-thickness resistance of the crystalline layer (so, for example, a reduction in resistance from 5,000,000 Ohms to 50,000 Ohms would be a reduction of 99%).

In some embodiments, the transfer of metallic species out of the crystalline layer results in an increase in the through-thickness resistance of the crystalline layer of at least 10×; at least 100×; at least 1000×; at least 10,000×; or more. As would be understood by those of ordinary skill in the art, an increase of the through-thickness resistance of the crystalline layer, in this context, is measured relative to the initial, lower through-thickness resistance of the crystalline layer (so, for example, an increase in resistance from 50,000 Ohms to 5,000,000 Ohms would be an increase of 100×).

As described elsewhere herein, the process of applying first and second voltages may be repeated multiple times, so that the switch may return from "ON" to "OFF" for one or multiple cycles. In some embodiments, each cycle (e.g., at least 2 cycles, at least 10 cycles, at least 100 cycles, at least $10^4$ cycles, at least $10^8$ cycles, at least $10^{12}$ cycles, at least $10^{15}$ cycles, or more) of switching can involve an increase and/or decrease of the through-thickness resistance of the crystalline layer within any of the ranges outlined above.

As noted above, in some embodiments, devices described herein may comprise a crystalline layer. The crystalline layer may comprise any of a variety of suitable materials. In some embodiments, the crystalline layer is an electrical insulator. In some embodiments, the crystalline layer comprises a group IV semiconductor, such as single-crystalline silicon or single-crystalline germanium, among others. In some embodiments, the crystalline layer comprises a group III-V semiconductor (including III-nitride semiconductors), such as boron nitride (BN), gallium nitride (GaN), gallium arsenide (GaAs), indium nitride (InN), indium phosphide (InP), or indium arsenide (InAs), among others. In some embodiments, the crystalline layer may include a group II-VI semiconductor, such as cadmium selenide (CdSe), zinc oxide (ZnO), zinc selenide (ZnS), or zinc sulfide, among others. In some embodiments, combinations of at least two materials may be used. In some embodiments, the crystalline layer is not a lithium intercalation compound.

As noted above, in certain embodiments, metallic species are transferred between the first electrode and the crystalline layer. As used herein, a "metallic species" can include metal atom(s), metal ion(s) in any oxidation state available for that particular metal, or both. The oxidation state of the metallic species may change upon application of a voltage across the first electrode and the second electrode, and may also change when the applied voltage is removed. In some embodiments, the metallic species may be a metal atom or ion that belongs to a larger agglomerate, such as a small cluster, a nanoparticle (e.g., nanocrystal, quantum dot, etc.), or any species that contains a metallic species that can migrate into the crystalline layer upon application of a voltage. In certain embodiments of the invention, the metallic species is present in an oxidation state of zero. In some embodiments, the metallic species is not in the form of a salt and has at least some covalent character between neighboring atomic species. For certain embodiments, the metallic species is neither oxidized nor reduced (i.e., it maintains an oxidation state of zero) upon transfer to the crystalline layer. In some embodiments, the oxidation state of the metallic species changes upon transfer from the active material of the first electrode to the crystalline layer. In some embodiments, at least one metal ion of the metallic species remains in ionic form after the resistance of the crystalline layer is altered.

In some embodiments, the crystalline layer is single crystalline. Single crystalline refers to a layer or solid wherein the crystal lattice of the entire solid is continuous and uninterrupted, i.e., without grain boundaries.

In other embodiments, the crystalline layer is polycrystalline. As used herein, a polycrystalline layer is a layer or solid consisting of multiple single crystalline parts (i.e., crystallites). In such solids, the crystallites may be randomly oriented with respect to each other. In a polycrystalline sample, crystallites may be separated by a grain boundary. In certain embodiments in which the crystalline layer is polycrystalline, the polycrystalline layer comprises passivated grain boundaries. In accordance with certain embodiments, the passivation of the grain boundaries of the polycrystalline layer generally reduces (or eliminates) the ability of the active material to be transported from the first electrode into the polycrystalline layer via the grain boundaries of the polycrystalline layer. The methods available to passivate the polycrystalline layer will generally depend upon the material from which the polycrystalline layer is made. One of ordinary skill in the art, given the insight provided by the present disclosure, would be capable of selecting a suitable passivation method for a particular polycrystalline material. As one example, in some embodiments, the polycrystalline material is polycrystalline silicon, and the passivation step comprises exposing the polycrystalline silicon to hydrogen plasma. Without wishing to be bound by any particular theory, it is believed that the hydrogen from the hydrogen plasma may occupy free bonds to allow for alteration of the electrical resistance of the polycrystalline layer.

In some embodiments, the crystalline layer may compromise a semiconductor. In some embodiments, the semiconductor may further comprises a dopant. In some embodiments, the dopant is boron. A variety of other suitable dopants is possible, such as aluminum (Al), gallium (Ga), indium (In), and hydrogen (H). Other dopants are also possible. In some embodiments, the concentration of dopant within the crystalline layer is at least $1\times10^{15}$ cm$^{-3}$, at least $1\times10^{16}$ cm$^{-3}$, at least $1\times10^{17}$ cm$^{-3}$, or at least $1\times10^{18}$ cm$^{-3}$. In certain embodiments, the concentration of the dopant within the crystalline layer is less than or equal to $1\times10^{23}$ cm$^{-3}$, less than or equal to $1\times10^{22}$ cm$^{-3}$, less than or equal to $1\times10^{21}$ cm$^{-3}$, less than or equal to $1\times10^{20}$ cm$^{-3}$, or less than or equal to $1\times10^{19}$ cm$^{-3}$.

In some embodiments, the concentration of holes in the crystalline layer is at least $1\times10^{15}$ cm$^{-3}$, at least $1\times10^{16}$ cm$^{-3}$, at least $1\times10^{17}$ cm$^{-3}$, or at least $1\times10^{18}$ cm$^{-3}$. In certain embodiments, the concentration of holes in the crystalline layer is less than or equal to $1\times10^{23}$ cm$^{-3}$, less than or equal to $1\times10^{22}$ cm$^{-3}$, less than or equal to $1\times10^{21}$ cm$^{-3}$, less than or equal to $1\times10^{20}$ cm$^{-3}$, or less than or equal to $1\times10^{19}$ cm$^{-3}$. In some embodiments, the concentration of holes in the crystalline layer is low enough to form a thick space-charge region that limits direct tunneling. Without wishing to be bound by any particular theory, it is believed that increasing the doping concentration produces a space-charge region that is shallow, resulting in a high and linear ON current. It is also believed that increasing the doping concentration reduces the potentiation threshold voltage.

In certain embodiments, the dopant is able to modulate at least a dimension of a Schottky barrier (or Schottky junction) between the first electrode and the crystalline layer. In certain embodiments, the dopant may modulate at least one trap state within the crystalline layer, if such trap states are present. In doing so, the resistance may be modulated as described above, i.e., to switch from an "ON" state to an "OFF" state or vice versa.

In some embodiments, the metallic species of the active material of the first electrode is not present as a dopant in the crystalline layer prior to application of the first voltage. As a non-limiting example, a crystalline layer of single crystalline or polycrystalline silicon can be deposited proximate to a first electrode (e.g., comprising silver, such as a layer of silver metal). In some such embodiments, the metallic species that is transported into and out of the crystalline layer can comprise silver atoms and/or silver ions.

As noted above, in some embodiments, devices described herein may comprise a first electrode and a second electrode disposed proximate to the crystalline layer. As used herein, an electrode is "proximate to" a crystalline layer if the electrode and the crystalline layer are capable of being put into a state (e.g., during operation of the device of which the electrode and the crystalline layer are a part) in which electrons can flow to and/or from the electrode to the crystalline layer. In some embodiments, the first electrode is sufficiently spatially close to the crystalline layer that metallic species from the first electrode can be transported into the crystalline layer upon application of a voltage. In some embodiments, the shortest distance between the crystalline layer and the first electrode can be less than or equal to 50 nm, less than or equal to 25 nm, or less than or equal to 10 nm. In certain embodiments, the shortest distance between the crystalline layer and the first electrode is essentially zero, i.e., the crystalline layer and the first electrode are in direct contact. As described herein, "direct contact" between two layers refers to a configuration where two layers have no intervening layer(s) in between them. FIG. 1B, for example, shows first electrode 110 in direct contact with crystalline layer 105. In addition, in FIG. 1B, second electrode 115 is in direct contact with crystalline layer 105. For certain embodiments, direct contact between the first electrode and the crystalline layer and/or between the second electrode and the crystalline layer may not be required, and in some embodiments, one or more materials may be present between the first electrode and the crystalline layer and/or between the second electrode and the crystalline layer.

In some embodiments, the first electrode and the crystalline layer are arranged such that the only material present between the first electrode and the crystalline layer is a native oxide of the crystalline layer material. In some embodiments, the second electrode and the crystalline layer are arranged such that the only material present between the second electrode and the crystalline layer is a native oxide of the crystalline layer material.

The first electrode can comprise any of a variety of suitable active materials. In one example, the first electrode may comprise a metal or metallic species. Non-limiting examples of metallic species that may be used include silver (Ag), aluminum (Al), gold (Au), copper (Cu), indium (In), nickel (Ni), Tin (Sn), and zinc (Zn). In some embodiments, the first electrode comprises silver (Ag). Other metallic species could also be used. In some embodiments, combinations of at least two metals (e.g., an alloy) may be used.

In some embodiments, a device for electrical switching or a method may comprise a second electrode disposed proximate to the crystalline later. In some embodiments, the second electrode does not provide metallic species to the crystalline layer. A variety of materials may be used to form the second electrode. In some embodiments, the second electrode may comprise a metal. This metal may establish, in some embodiments, an Ohmic contact with the crystalline layer. It may be advantageous, in some cases, to use a metal with a relatively high work function. In some embodiments, it may be advantageous to use metals that diffuse into semiconductors and act as acceptors (e.g., Al and/or In). Non-limiting examples of metals that may be used in the second electrode include gold (Au), platinum (Pt), aluminum (Al), and indium (In) or a mixture of one or more of these. In some embodiments, the second electrode comprises a conductive metal-containing compound such as a metal nitride (e.g., TiN), a metal boride (e.g., $TiB_2$), a metal silicide (e.g., $MoSi_2$), a metal oxide (e.g., $n-BaTiO_3$, $Fe_2O_3$, $Ti_2O_3$, $ReO_3$, $RuO_2$, and/or $IrO_2$), among others. In some embodiments, the second electrode may include carbon-based conductive materials, such as graphene. In some embodiments, combinations of at least two materials may be used.

In some embodiments, the crystalline layer has a thickness of 2 nm to 1 µm. In some embodiments, the thickness of the crystalline layer can be 2 nm to 1 µm (e.g., 2 nm, 5 nm, 10 nm, 20 nm, 50 nm, 100 nm, 200 nm, 500 nm, or 1 µm, including any values and sub ranges in between). The thickness of the crystalline layer can also be less than 2 nm or greater than 1 µm, depending on the desired performance of the resulting switch. For example, decreasing the thickness of the crystalline layer can decrease the distance for metallic species to migrate from the first electrode to reach the second electrode, thereby increasing the switching speed. On the other hand, increasing the thickness of the crystalline layer can decrease the probability of conductive filament formation at an undesired location due to, for example, discharge. This can in turn improve the stability of the resulting switch. In some embodiments, the thickness of the first electrode can be 5 nm to 10 µm (e.g., 5 nm, 10 nm, 20 nm, 50 nm, 100 nm, 200 nm, 500 nm, 1 µm, 2 µm, 3 µm, 4 µm, or 5 µm, including any values and sub ranges in between).

In some embodiments, the density of line defects within the crystalline layer is less than 100 line defects per square micron. In some embodiments, the density of line defects within the crystalline layer is less than 10, less than 1, less than 0.1, less than 0.01, or less than 0.001 line defects per square micron. In some embodiments, the crystalline layer is substantially free of line defects.

Figure 4:
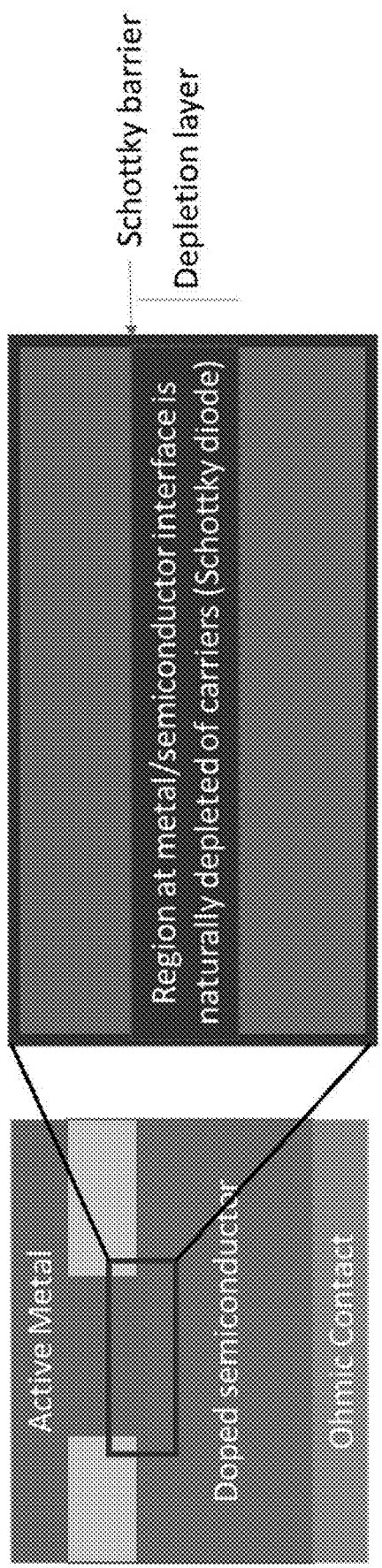
FIG. 4 depicts a region at the metal/semiconductor interface naturally depleted of carriers to form a Schottky diode, according to some embodiments.

In some embodiments, the first electrode and the crystalline layer form a Schottky junction. It is understood by those skilled in the art that a Schottky junction (or, interchangeably, a Schottky barrier) is a potential energy barrier formed at metal-semiconductor junction due to a difference in the work function between the metal and the semiconductor. The height of this barrier will vary depending on the identity of the metal and the semiconductor. Further, as is understood by those skilled in the art, a depletion zone (e.g., a depletion layer) may form between the first electrode and the crystalline layer when a Schottky barrier is formed. A non-limiting example of this process is shown in FIG. 4. In some embodiments, the application of a voltage across the first electrode and the crystalline layer, and the subsequent transfer of metallic species, results in a change of the Schottky barrier height which may alter the resistance of the crystalline layer.

Without wishing to be bound by any particular theory, it is believed that the presence of the Schottky junction between the first electrode and the crystalline layer can result in the reduction of parasitic losses during operation of the system, relative to systems that do not include Schottky junctions but that are otherwise identical.

Layered devices in accordance with the present disclosure may have any suitable structure. In some embodiments, the device may include one or more electrodes where the electrodes are separated by gap. In some cases, a crystalline layer occupies the gap that provides this separation. In some embodiments, the crystalline layer is substantially free of electrically conductive material. For instance, the crystalline layer may comprise a non-electrically conductive material (e.g., organic material, polymer, etc.), that is absent of additional conductive fillers (e.g., carbon/metal particles, etc.). It can be appreciated that the manner in which the device is fabricated and the manner of operation thereof may appropriately vary, largely dependent upon the overall structure of the device.

In some embodiments, the second electrode and the crystalline layer form an Ohmic contact. It is understood by those of ordinary skill in the art that an Ohmic contact is a non-rectifying electrical junction that has a linear current-voltage (I-V) curve as with respect to Ohm's law (i.e., V=IR). Low resistance Ohmic contacts may be used to allow charge to flow easily in both directions between the two conductors, without blocking due to rectification or excess power dissipation due to voltage thresholds.

In some embodiments, metallic species from the active material of the first electrode are transferred into interstices of a crystal lattice of the crystalline layer. As used herein, interstices (interchangeable with "interstitial sites") of a crystal lattice refer to the empty spaces between atoms in a crystal lattice. In some embodiments, upon application of a voltage, metallic species from the first electrode may be transferred into these interstices to alter the resistance of the crystalline layer. In certain embodiments, the metallic species may alter the resistance of the crystalline layer without occupying the interstices of the crystal lattice.

The metallic species can be transferred into the crystalline layer to any of a variety of suitable depths. In some embodiments, the metallic species can be transferred a distance into the crystalline layer a length that is at least one lattice spacing. In some embodiments, the metallic species can be transferred a distance into the crystalline layer that is at least 1%, at least 5%, at least 10%, or at least 25% of the thickness of the crystalline layer.

In some embodiments, the at least one metallic species alters the resistance of the crystalline layer without forming a conductive filament in the crystalline layer. In some embodiments, upon application of the first voltage, metallic species from the active material of the first electrode can migrate into the crystalline layer (e.g., into interstitial spaces within the crystalline layer) and/or into the depletion zone formed between the first electrode and the second electrode to form a percolating conductive network in the first electrode and/or the crystalline layer. This process is illustrated, for example, in FIGS. 1A-1F.

As used herein, a "percolating conductive pathway" describes a network that forms when metallic species are spaced sufficiently close to allow for the transport of electrical current, but not so closely that they establish a continuous solid pathway. A percolating conductive pathway has generally been formed when the fraction of metallic species within a given medium reaches the percolation threshold. The percolation threshold is a concept known in the art and refers to the phenomenon by which the conductivity of a medium (e.g., the crystalline layer) begins a rapid change from being electronically insulating to electronically conductive. In some embodiments, the metallic species migrates into trap states within the crystalline layer in order to alter the resistance of the crystalline layer.

In some embodiments, metallic species from the active material of the first electrode are transferred to the crystalline layer upon applying a first voltage across the first electrode and the second electrode. In some embodiments, a voltage of 4V (or more) is applied across the first and second electrodes. In some embodiments, the first voltage is from 4 V to 6 V. In some embodiments, at least one metallic species is configured to retreat back to the first electrode in response to a second voltage applied across the first and second electrodes. In some embodiments, the second voltage has a second polarity opposite to a first polarity of the first voltage. In some embodiments, applying a second voltage, having a second sign opposite to the first sign, between the first electrode and the second electrode causes the plurality of metallic species to retreat back to the first electrode. In some embodiments, applying the second voltage, having a second sign opposite to the first sign, between the first electrode and the second electrode causes Joule heating of the crystalline layer. In some such embodiments, applying the second voltage between the first electrode and the second electrode causes the temperature of the crystalline layer to increase by at least 0.01° C., at least 0.05° C., at least 0.1° C., at least 0.5° C., at least 1° C., or more.

In certain embodiments, the application of the first voltage may cause an ionic flux from the first electrode into the crystalline layer.

In some embodiments, the first electrode has a first solubility less than 1% in the crystalline layer and/or the second electrode has a second solubility less than 1% in the crystalline layer. In some embodiments, the solubilities are room temperature solubilities. In certain cases, it can be beneficial for the solid solubility of the active material in the crystalline layer to be less than 1% (atomic percentage) so as to reduce the probability for the active material forming a compound with the crystalline layer. In one example, the solid solubility of the active material in the crystalline layer is less than 1% at room temperature. In some embodiments, the solid solubility of the active material in the crystalline layer is to be less than 1% at high temperature (e.g., at or above 400 K, 500 K, 750 K, 1000 K, or higher). In yet another example, the solid solubility of the active material in the crystalline layer is, in some embodiments, less than 0.1% (e.g., less than 0.1%, less than 0.05%, less than 0.02%, or less than 0.01%, including any values and sub ranges in between) at a temperature of 298 K. In yet another example, the solid solubility of the active material in the crystalline layer is, in some embodiments, less than 0.1% at high temperature (e.g., at or above 400 K, 500 K, 750 K, 1000 K, or above).

Those of ordinary skill in the art, given the insight provided by the present disclosure, are familiar with fabrication methods that could be used to form the devices herein. As one non-limiting example, the first and second electrodes could be deposited on the crystalline material, for example, using physical deposition methods (e.g., evaporation, sputtering, etc.), chemical deposition methods (e.g., chemical vapor deposition, etc.), epitaxial deposition methods, or any other suitable deposition methods. As another non-limiting example, the crystalline material could be grown on a substrate comprising one or both of the electrodes (e.g., using any suitable deposition method). Optionally (e.g., if the second electrode was not present on the original growth substrate), the second electrode could then be deposited over the crystalline material. Other techniques could also be used.

Those of ordinary skill in the art, given the insight provided by the present disclosure, are also familiar with methods that could be used to fabricate arrays of the devices described herein. For example, the array fabrication methods described in International Patent Application No. WO 2017/222592 (which is incorporated herein by reference in its entirety) could be used. Other methods are also possible.

In some embodiments, the devices and methods described herein may provide one or more advantages over devices and methods known in the art. For example, certain devices and methods described herein may provide enhanced electrical switching for uses in non-volatile memory storage and switching devices, which in turn can be used in a wide variety of devices such as computers, tablets, smart phones, solid state drives (SSDs), thumb drives, and other devices. The devices could also be used in neuromorphic computing applications. Other applications where electrical switching is useful in the operation of an electrical device are also possible.

U.S. Provisional application No. 63/066,344, filed Aug. 17, 2020, and entitled "Memristors and Related Systems and Methods," and U.S. Provisional Application No. 62/964,003, filed Jan. 21, 2020, and entitled "Memristors and Related Systems and Methods," are incorporated herein by reference in their entireties for all purposes.

The following examples are intended to illustrate certain embodiments of the present invention, but do not exemplify the full scope of the invention.

Example 1

This example describes the fabrication and testing of an exemplary electrical switch, in accordance with certain embodiments. A schematic illustration of this process is shown in FIG. 3.

Figure 3A:
FIGS. 3A-3D are schematic illustrations showing the fabrication of a Schottky barrier memristor, according to certain embodiments.
Figure 3B:
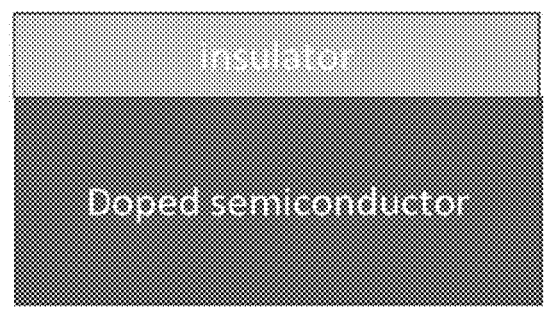
Figure 3C:
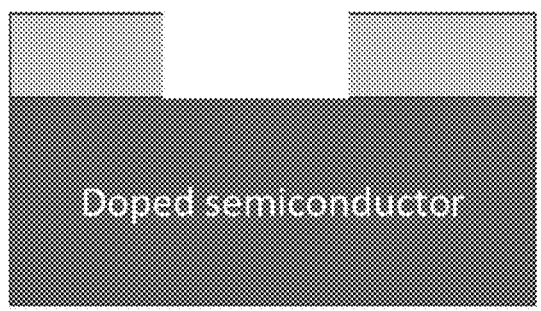
Figure 3D:
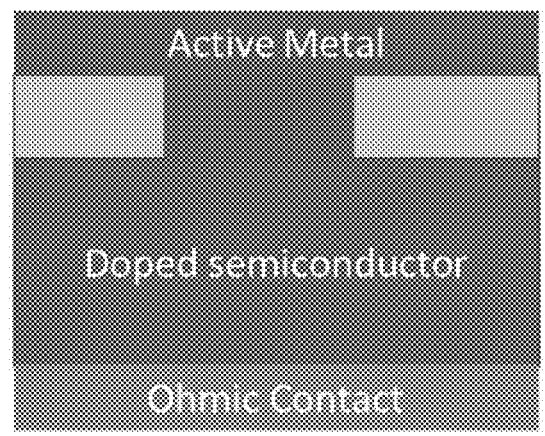

An 80-nm thick insulator (which was used as a blocking layer) was deposited on a doped single crystalline silicon layer using plasma-enhanced chemical vapor deposition, as shown in FIG. 3B. This insulator layer was then etched using photolithography, followed by a 5:1 buffered oxide etch (BOE 5:1, $NH_4F$:HF in $H_2O$) for 2 min, as shown in FIG. 3C. Next, a first electrode was deposited using electron beam evaporation of 100-nm Ag, +20-nm Pd, and +100-nm Au. Next, a second electrode was deposited on the back side of this wafer using electron beam evaporation of 1.5-nm Ti and 100-nm Au. The device as formed after the deposition of the electrodes is shown in FIG. 3D.

Example 2

This example describes the process of actuating devices (for example, as described in Example 1) for electrical switching.

Figure 6A:
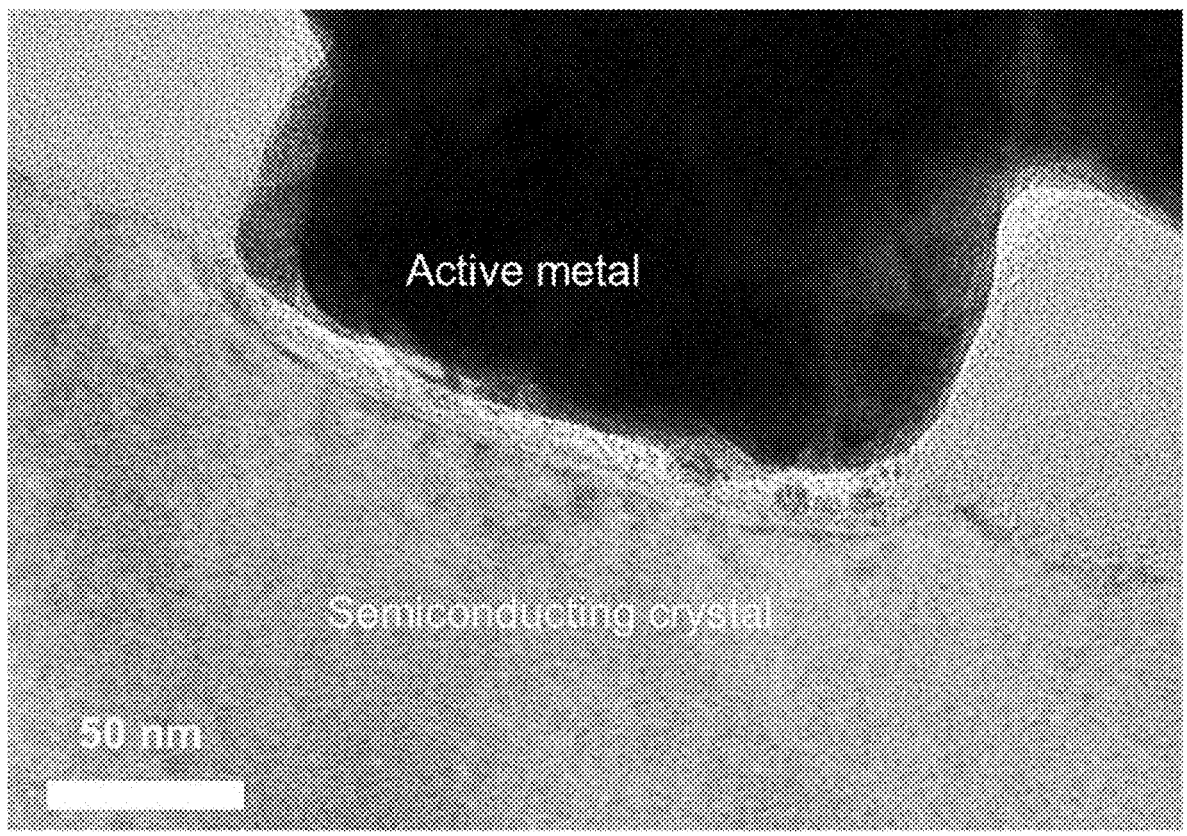
FIG. 6A is a transmission electron microscopy (TEM) image of a crystalline RRAM artificial synapse, in accordance with certain embodiments.

Devices comprising p-type single crystalline silicon doped with boron (concentration $\sim 1\times 10^{-18}$ $cm^{-3}$) as the crystalline layer, silver as the first electrode, and Ti/Au as the second electrode were fabricated as described above in Example 1. The inactive metal electrode (Ag/Pd/Au) was engineered to make ohmic contact with the single crystal silicon semiconductor so that the active region for switching was the interface of the active metal electrode (Ag) and the semiconductor. A transmission electron microscopy (TEM) image of a potentiated crystalline RRAM is shown in FIG. 6A. Darker regions in the semiconductor near the active metal electrode suggests metal migration has occurred.

Figure 6B:
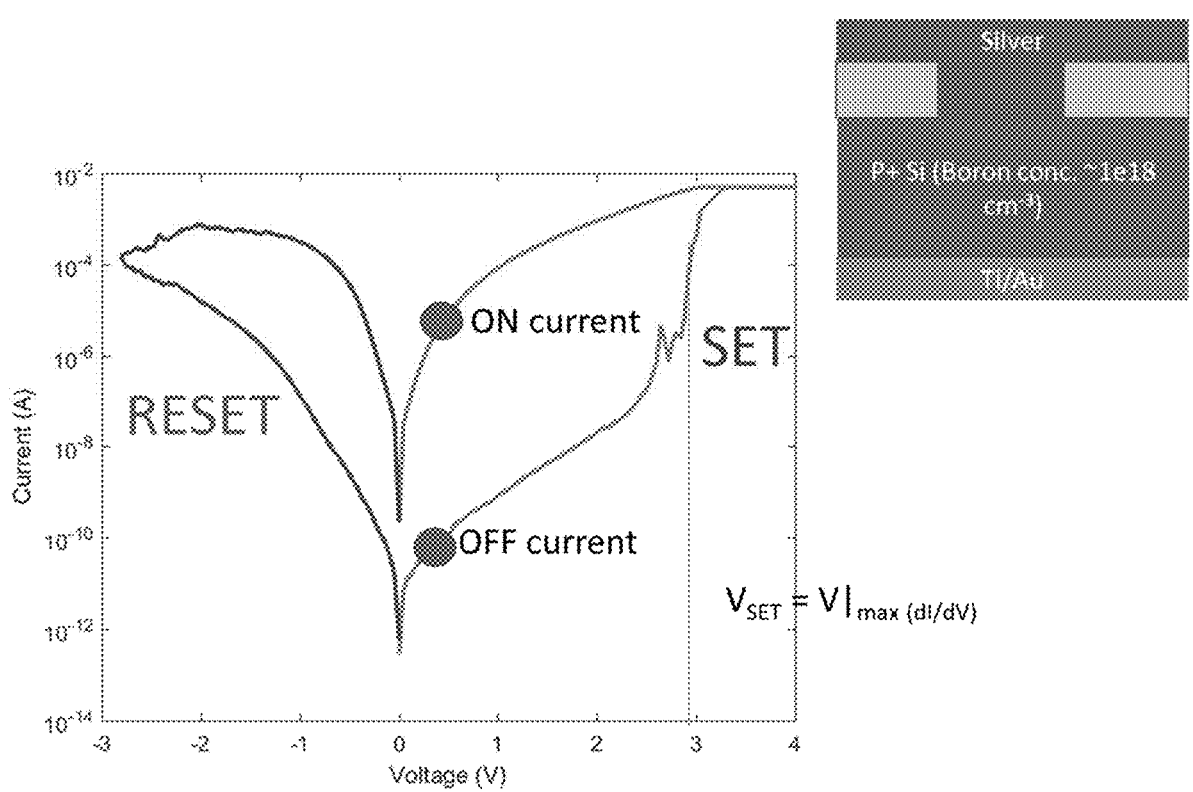
FIG. 6B shows quasi-static DC measurements of a memristor device comprising silver, p-type Si, and Ti/Au, according to one embodiment.

Quasi-static current-voltage (I-V) measurement revealed resistive switching behavior of the crystalline RRAM. An example of typical I-V response is shown in FIG. 6B. An applied voltage (a forward DC bias of 3V) was used to actuate the device with an ON current and an OFF current as depicted in FIG. 6B. The device shown in the I-V plot started in the OFF (low conductance) state. As positive voltage was applied, the crystalline RRAM switched ON at 2.8 V, as indicated by the drastic current increase. As voltage was lowered from 4 V to 0 V, the current was much higher, indicating the device had been turned ON. The voltage of the steepest current change was defined as the SET voltage or potentiation threshold voltage. Single crystalline RRAM set ON could be reset back to the OFF state by applying negative bias. Joule heating likely played an important role in the reset process.

Figure 7A:
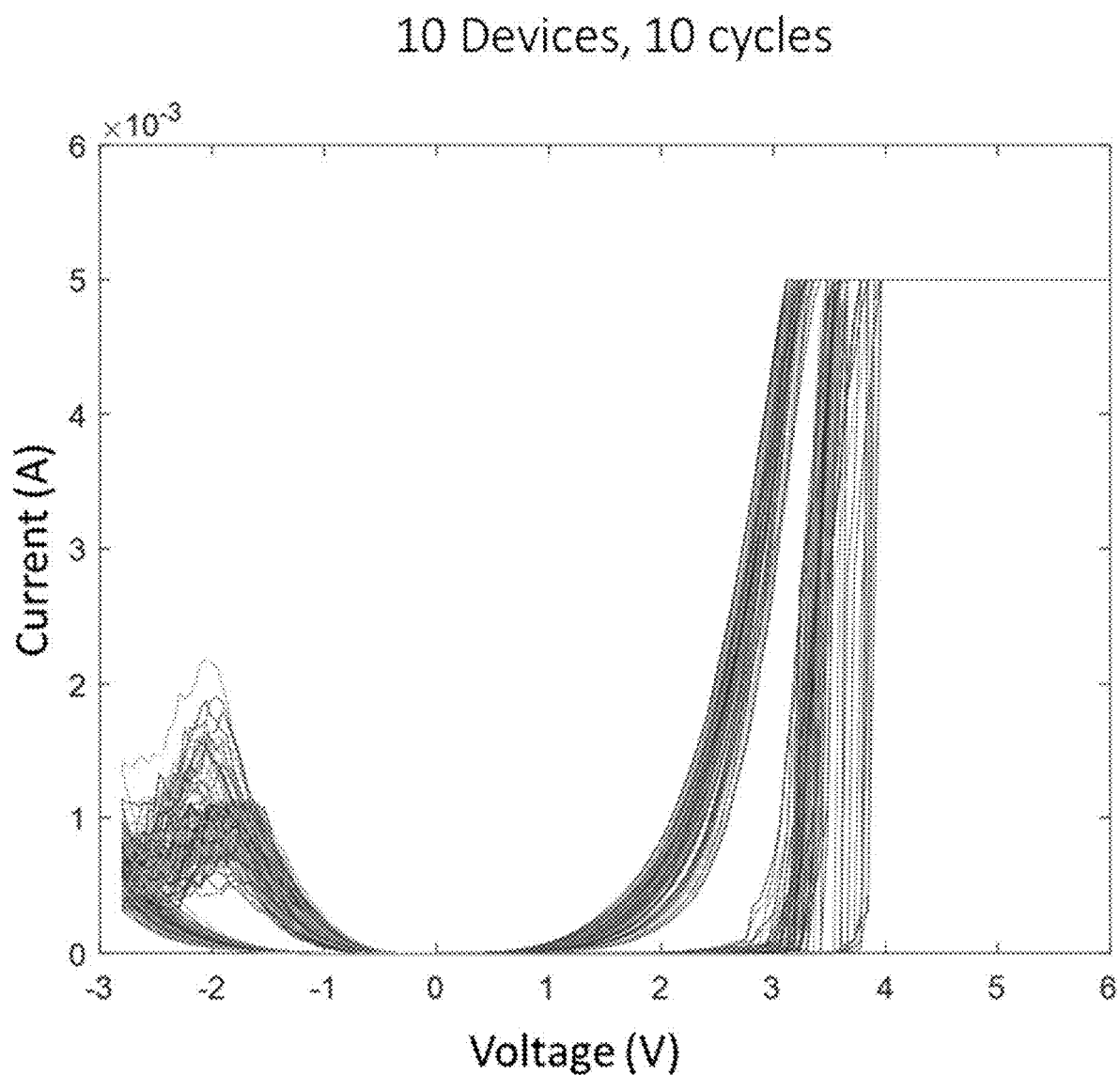
FIGS. 7A-7C shows the spatiotemporal current-voltage behavior for 10 devices through 10 cycles, according to one set of embodiments.
Figure 7B:
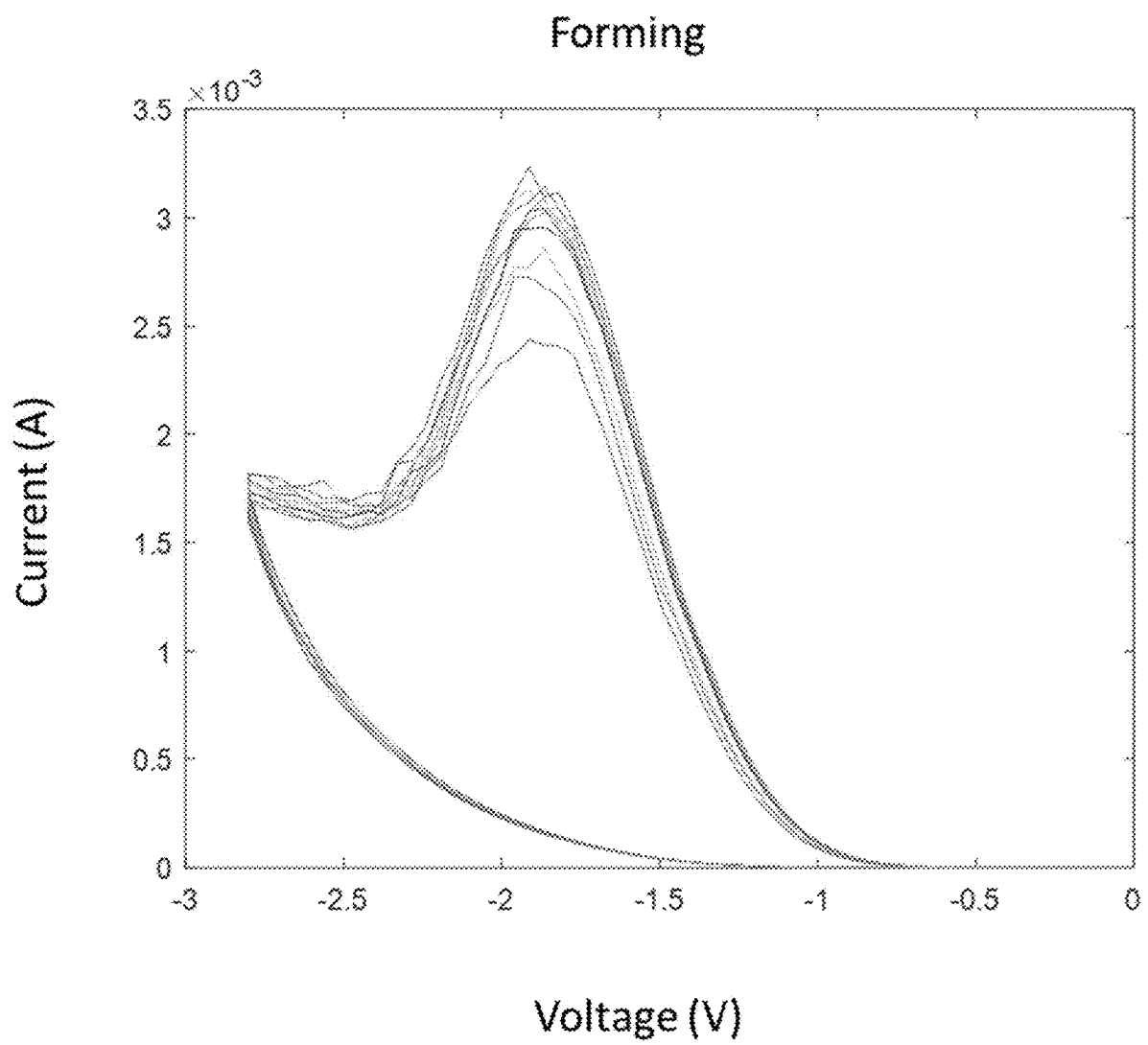
Figure 7C:
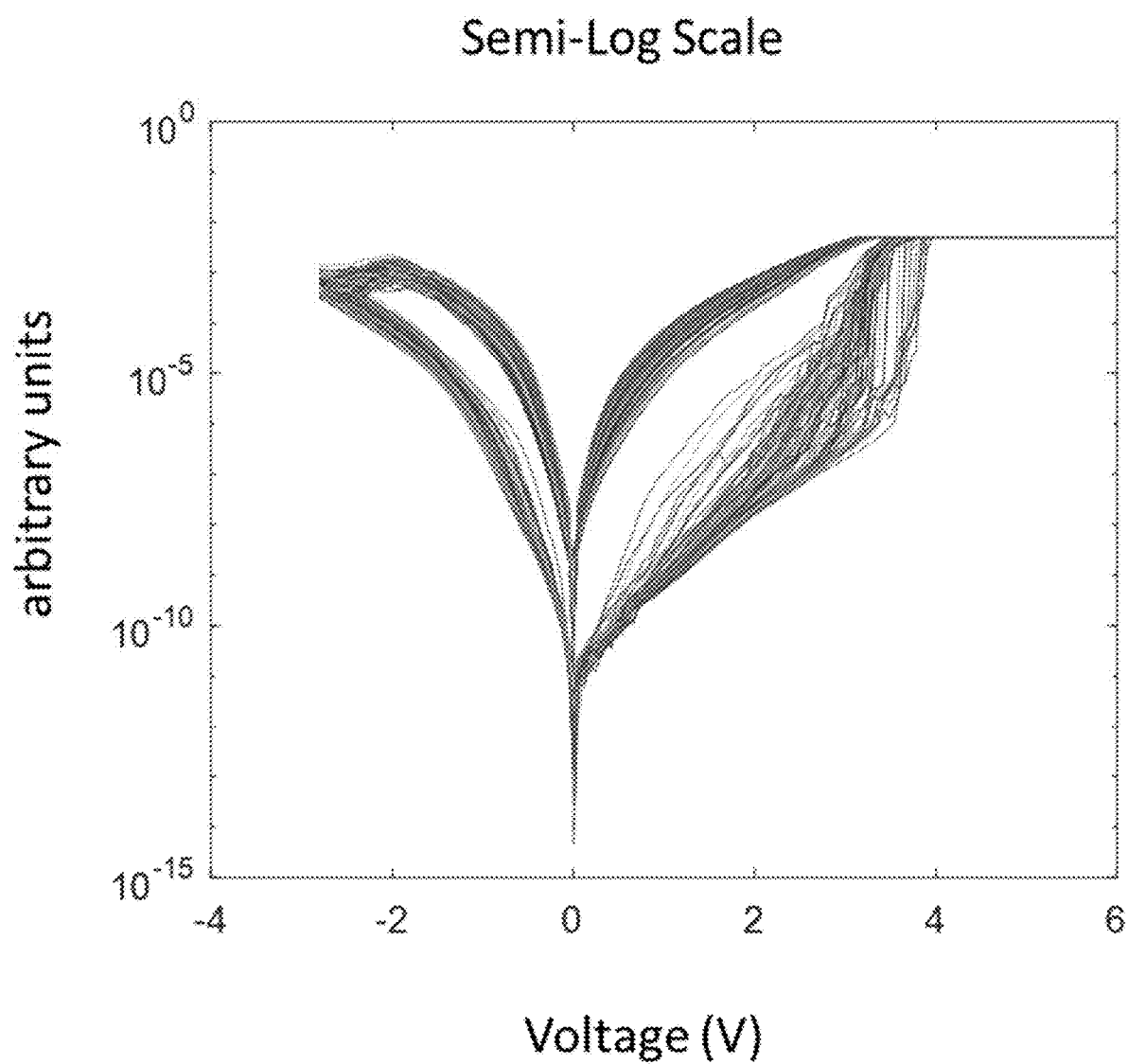
Figure 8:
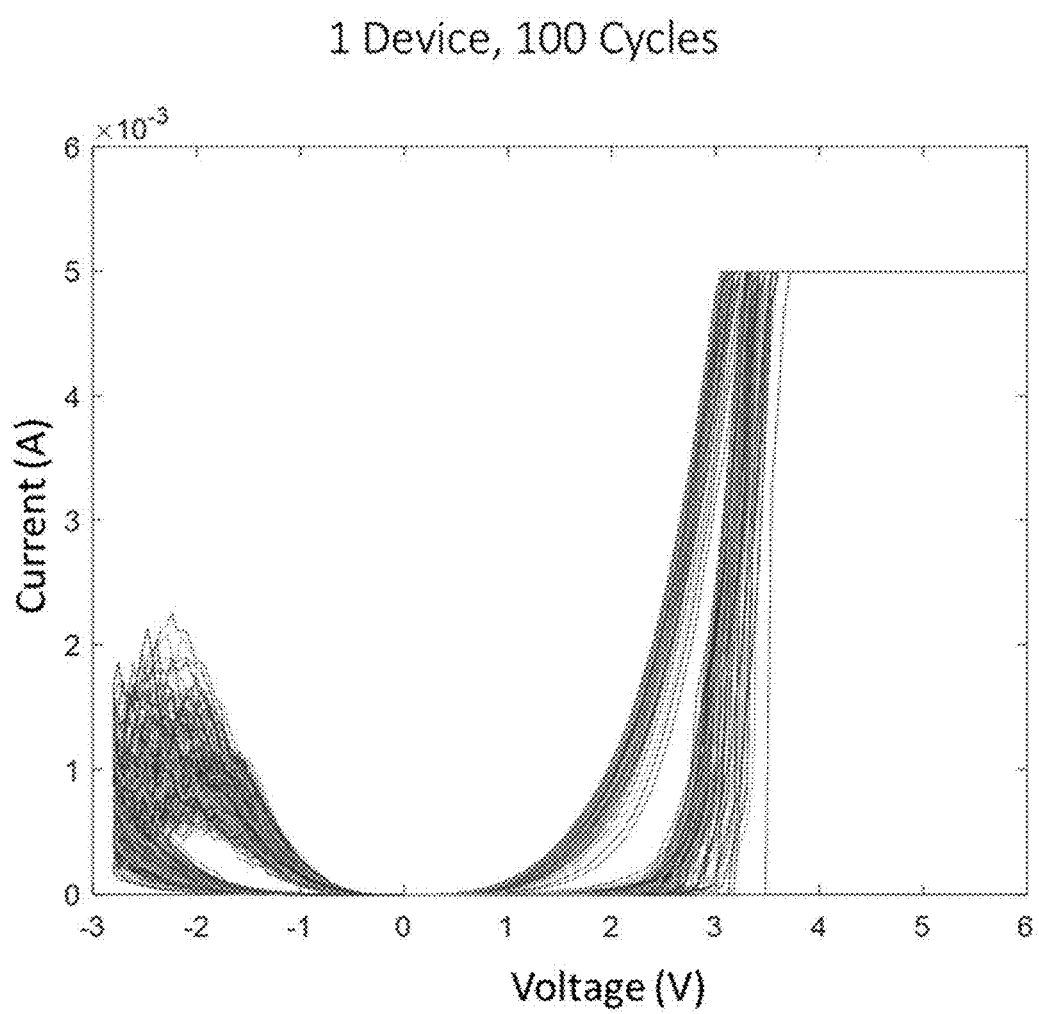
FIG. 8 shows a plot of the spatiotemporal current-voltage behavior of 1 device through 100 cycles of switching, according to one set of embodiments.
Figure 9A:
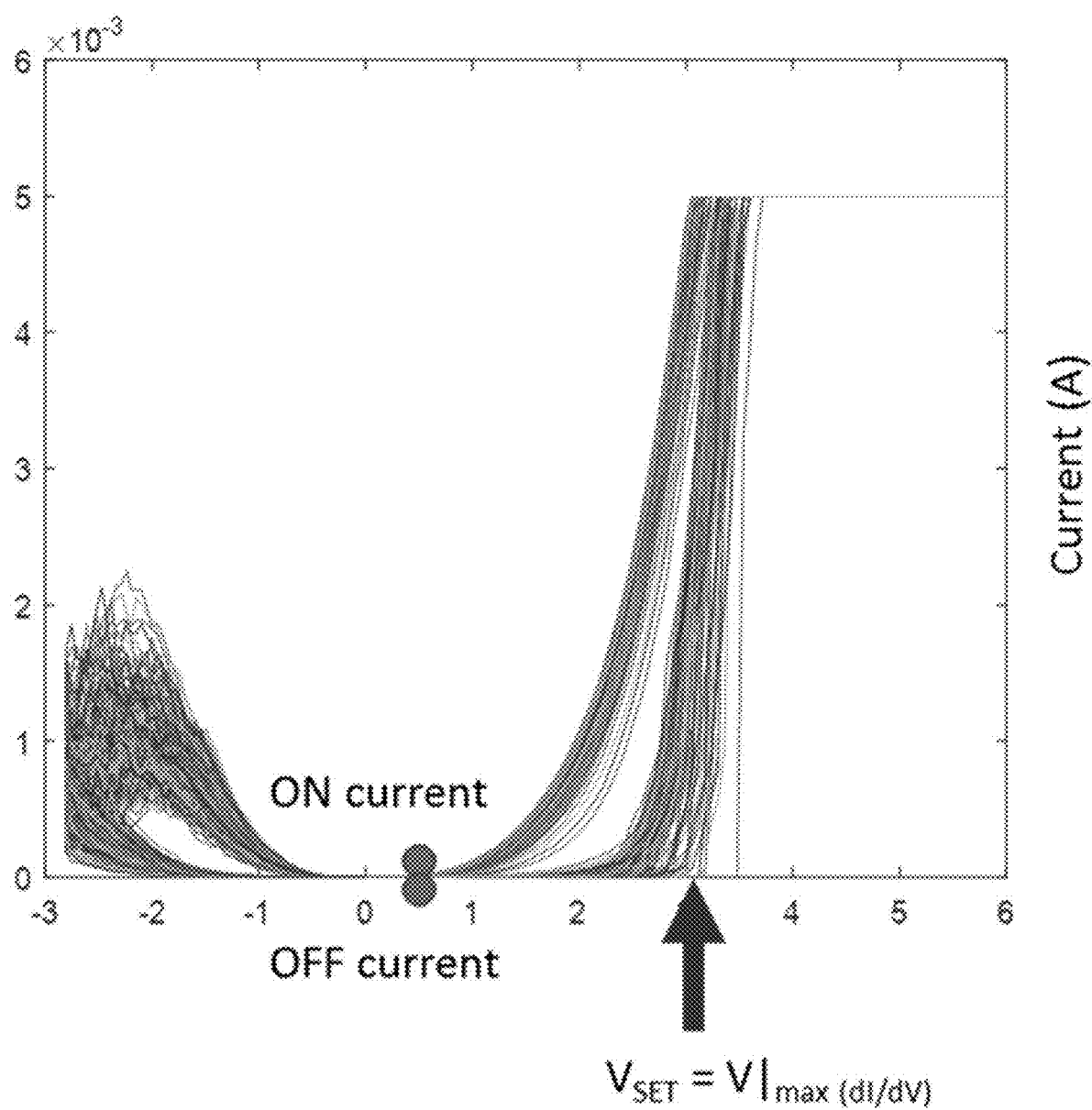
FIGS. 9A-9C illustrate the temporal on and off current and $V_{set}$ for a device through up to 300 cycles, according to one set of embodiments.
Figure 9B:
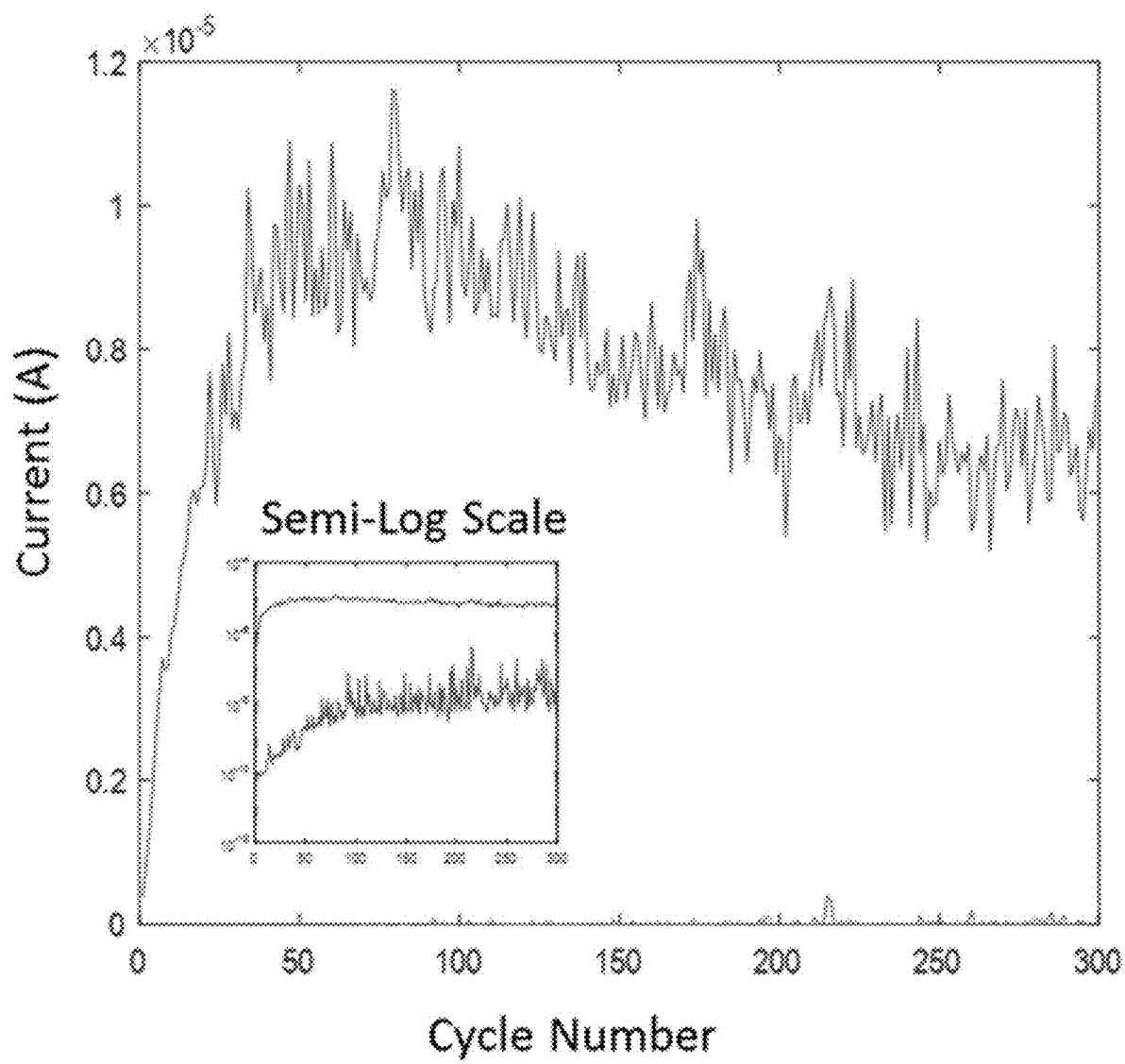
Figure 9C:
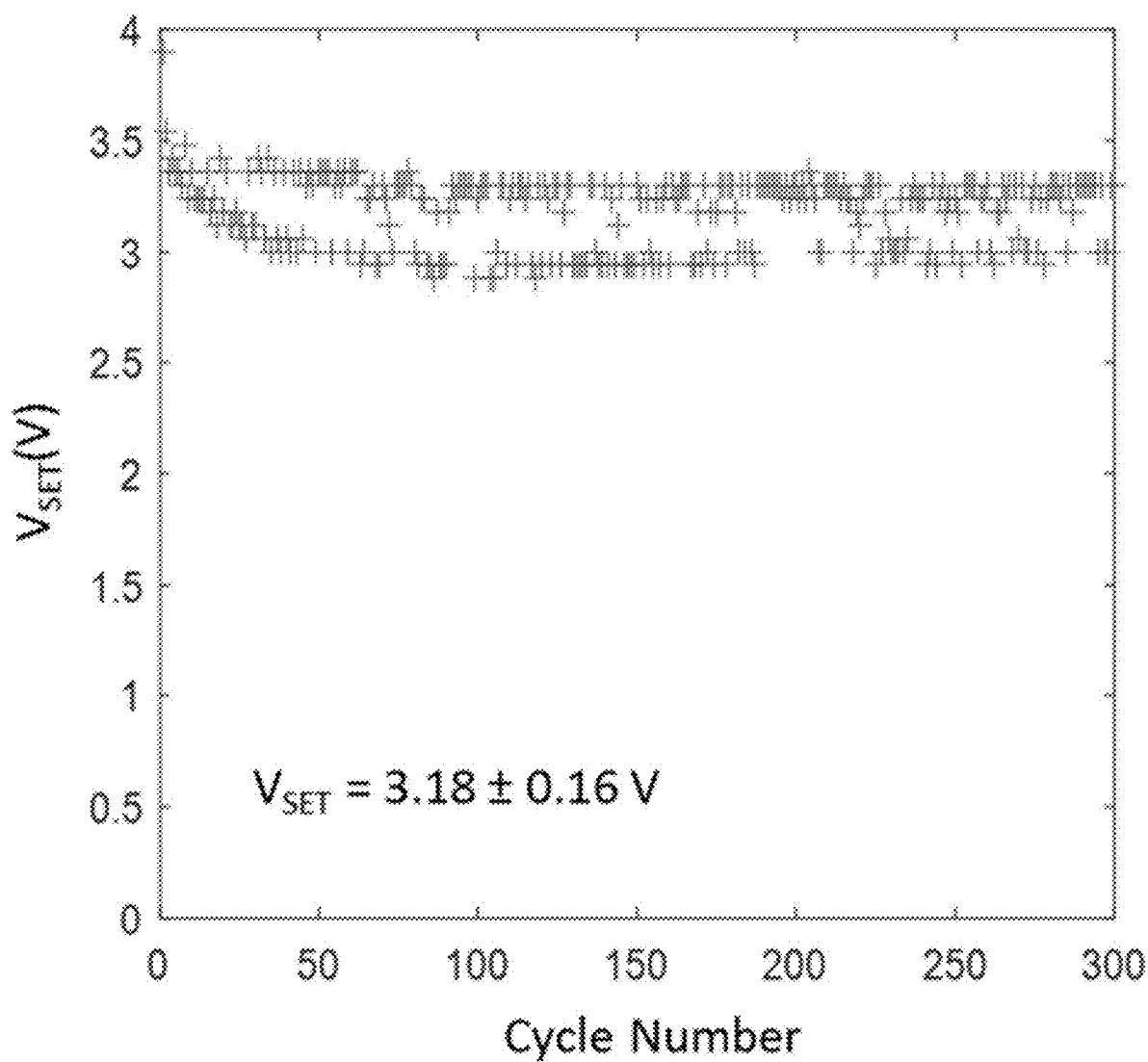

This process was repeatable for multiple cycles across several devices (e.g., 10 devices), as shown in FIGS. 7A-7C. In one embodiment, one device may be actuated for at least 100 cycles, as shown in FIG. 8. The ON and OFF current and voltage were temporally stable, illustrated by FIGS. 9A-9C.

Figure 6C:
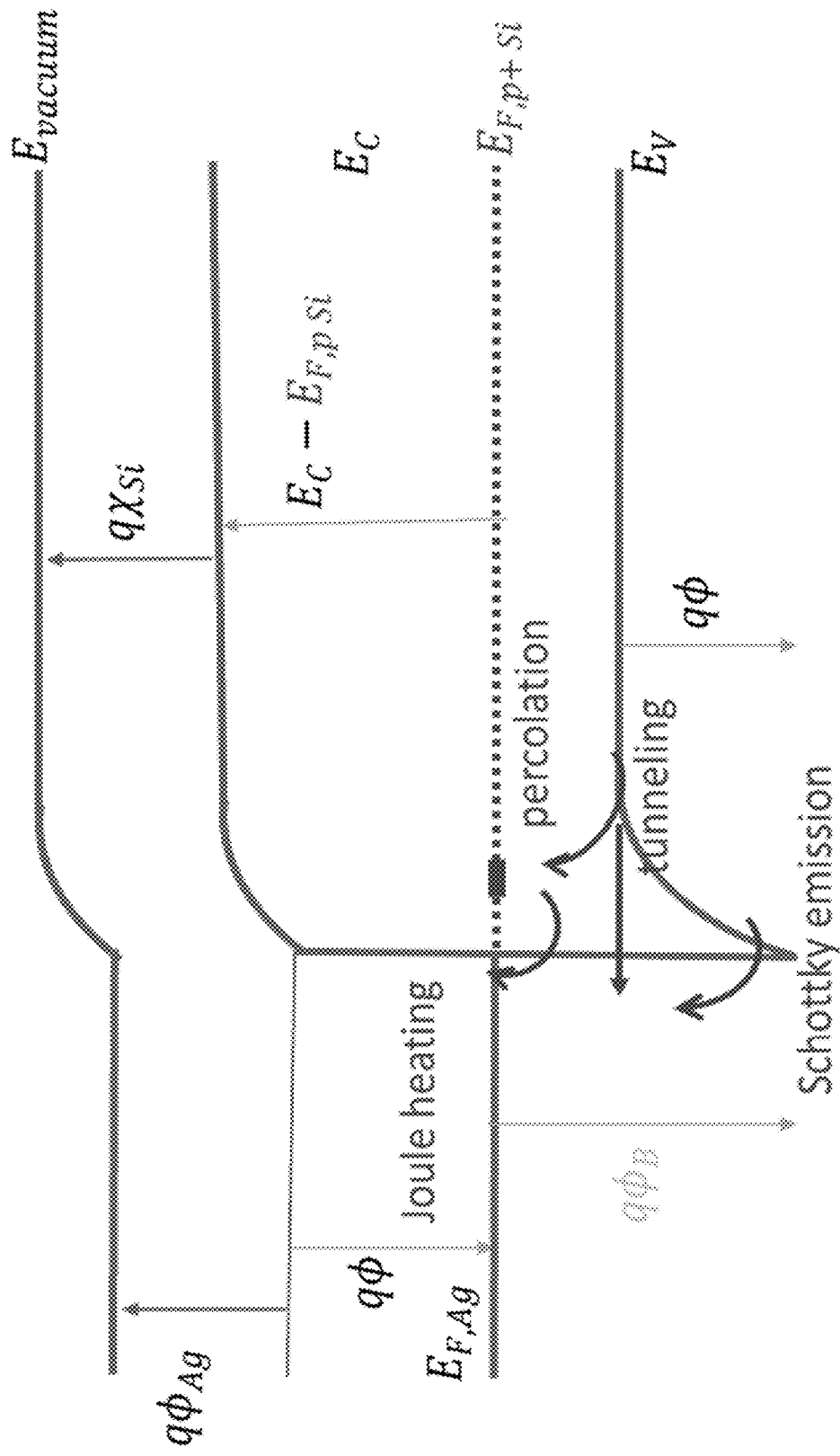
FIG. 6C is a band diagram of a Ag/p+Si Schottky interface, in accordance with certain embodiments.

The metal/semiconductor switching interface could be modeled as a Schottky barrier junction. FIG. 6C is an example band diagram for the Ag-p+Si interface. A built-in potential can form at the interface region. It is believed that electrons diffuse to occupy holes in the semiconductor. It is also believed that diffusion is balanced by drift to form a dielectric layer, known as the space-charge region. It is believed that activity within this region is important for resistive switching.

Figure 6D:
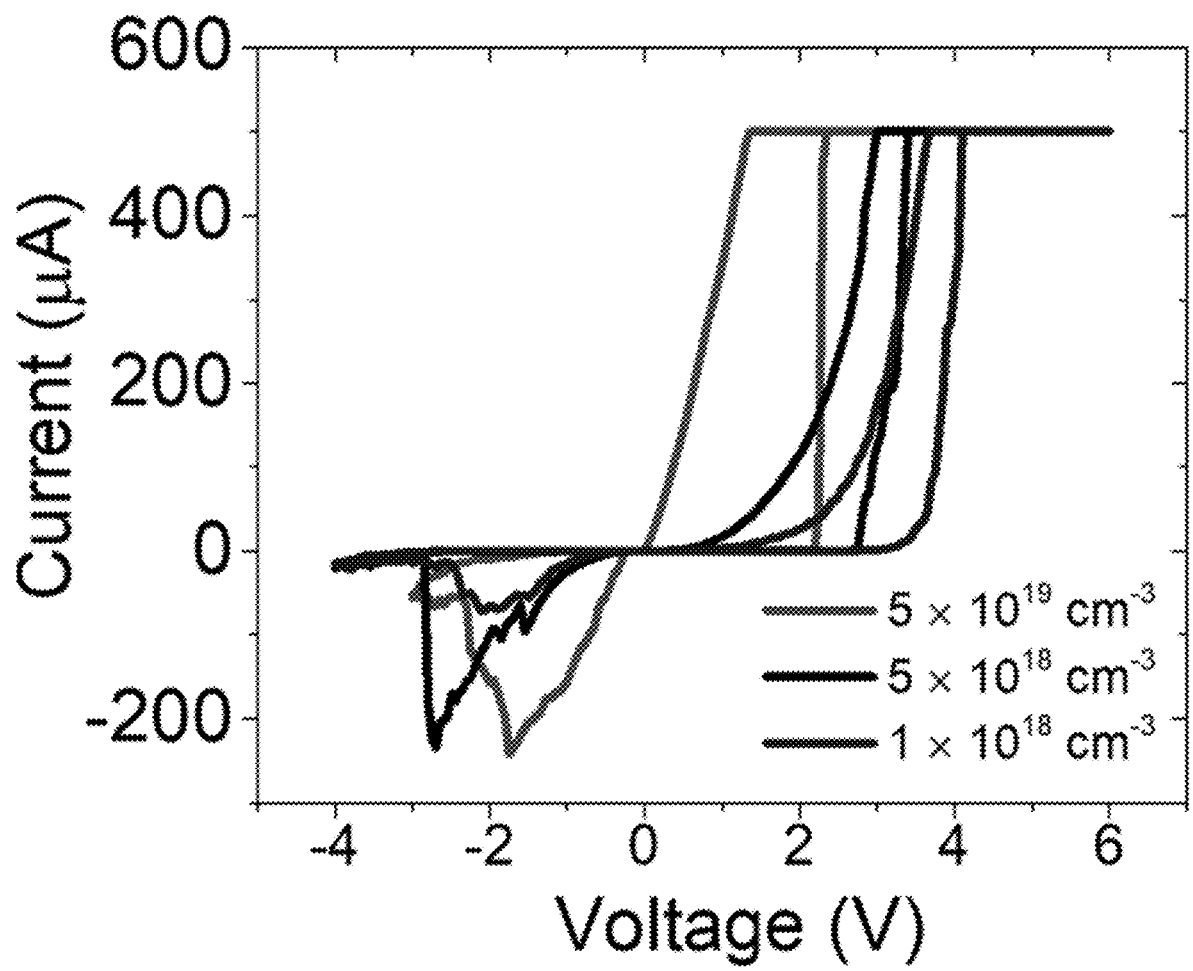
FIG. 6D is a plot of current vs. voltage showing that the I-V of a single crystalline device, in accordance with certain embodiments.

The doping concentration of holes in the semiconducting crystal was selected to be low enough to form a thick space-charge region that limits direct tunneling. Altering the doping concentration changed the shape of the I-V curve for a crystalline RRAM device, as shown in FIG. 6D. Increasing the doping concentration resulted in a high and linear ON current, as the space-charge region was shallow. Increasing the doping concentration also reduced the potentiation threshold voltage.

Without wishing to be bound by any particular theory, it is believed that potentiation could involve metal moving into the semiconductor interface. Metal nanoclusters in the semiconductor interface could be ion hopping sites. Electronic percolation through the interface region could increase as metal moves into the space-charge region. Depression could involve metal moving out from the space-charge region back towards the active electrode. Depression is suspected to involve Joule heating of metallic clusters to drive ionization and drift toward the negatively-charged electrode terminal.

Example 3

Figure 10A:
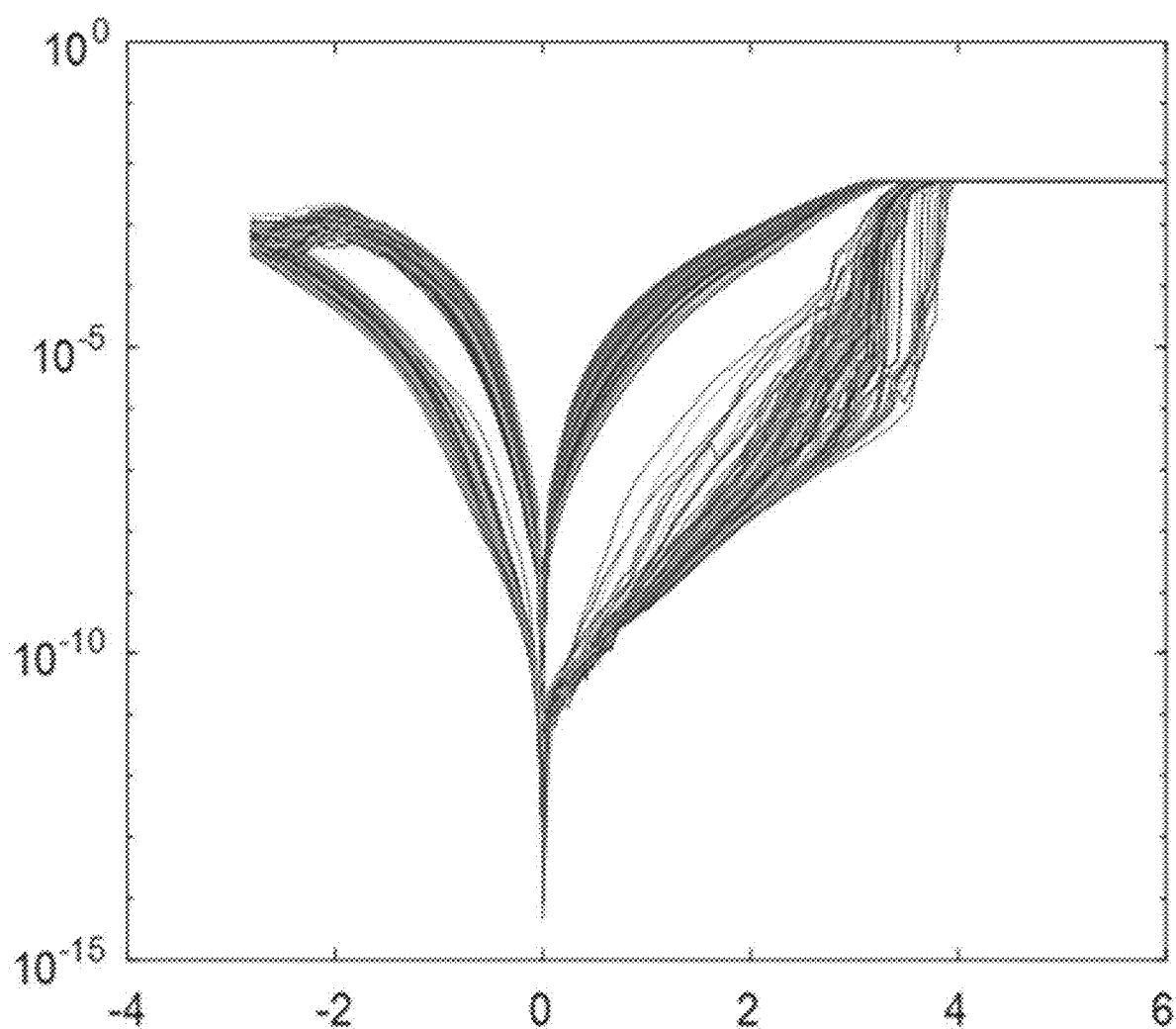
FIGS. 10A-10C show the spatial on/off and $V_{set}$ for 10 devices for electrical switching, according to one set of embodiments.
Figure 10B:
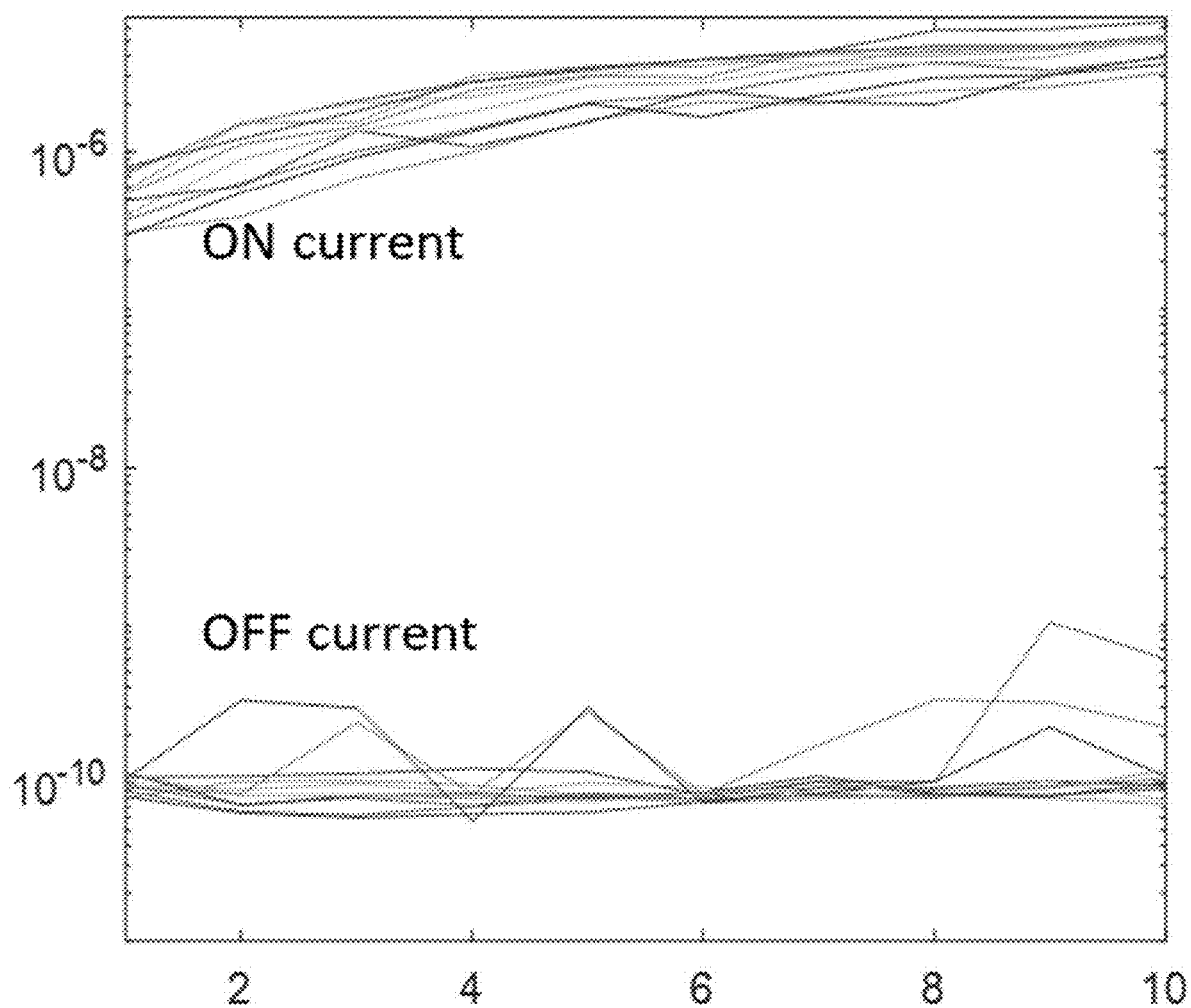
Figure 10C:
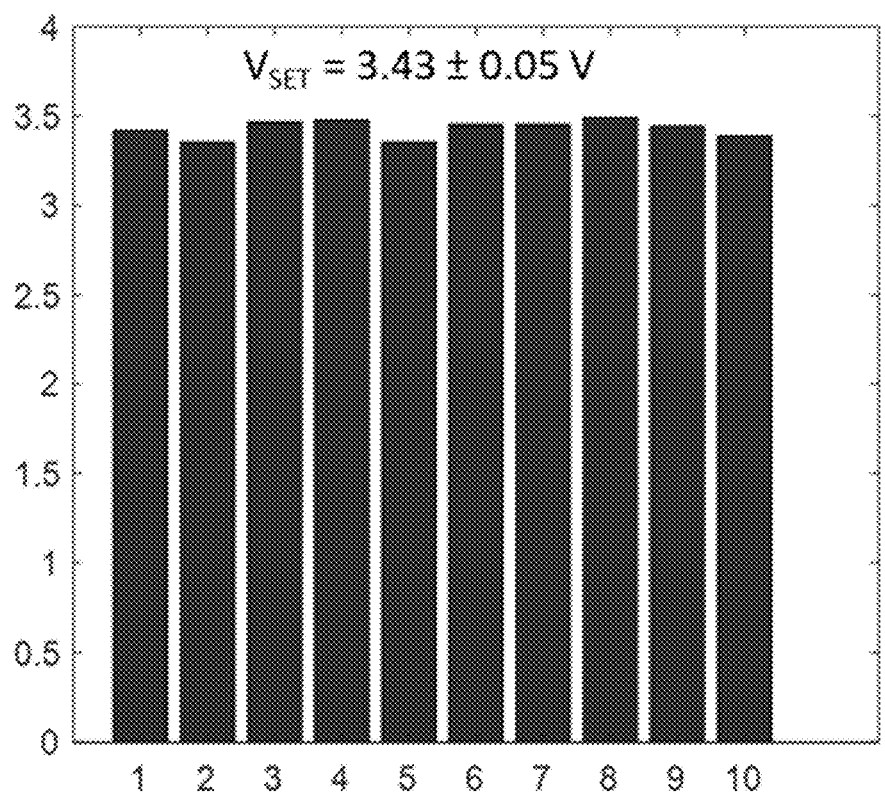

This example describes the stability of several separate devices. 10 devices for electrical switching were fabricated as described above. Each device was actuated at the same voltage (0.5 V). FIG. 10A is an I-V curve of the 10 devices, each cycled 10 times, at a voltage of 0.5 V. FIG. 10B is a plot of ON and OFF currents for the 10 cycled devices, at a voltage of 0.5 V. FIG. 10C shows set voltages for each of the 10 devices. FIGS. 10A-10C show that multiple devices fabricated according to the methods described herein exhibit consistent performance.

Figure 12:
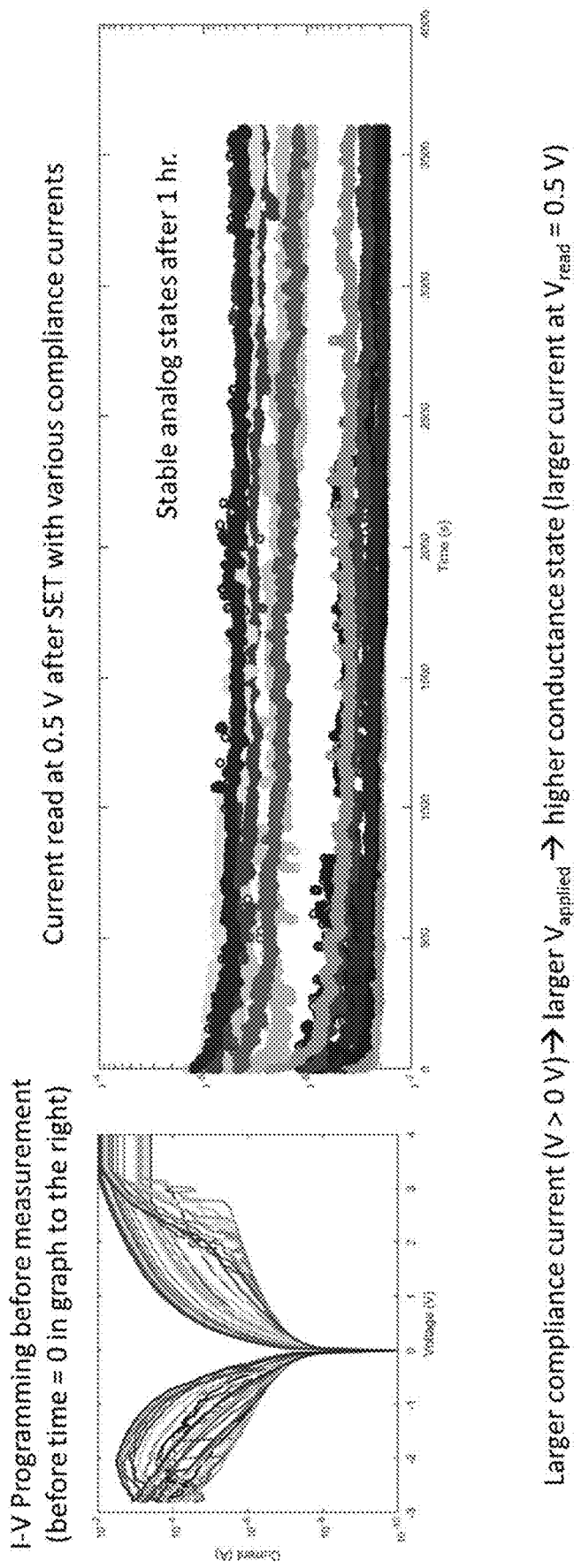
FIG. 12 depicts multi-level stable conductance states for memristor devices, according to one set of embodiments.

FIG. 12 includes plots of current as a function of voltage (left-hand plot) and current as a function of time (right-hand plot) for one tested device. FIG. 12 illustrates that devices can be set to have multi-level stable conductance states by adjusting the voltage/current profile of the device prior to t=0, where t=0 begins on the right. Multi-level conductance states in crystalline RRAM may manifest from different quantities of metal that contribute to percolation through the Schottky interface. Analog states can be programmed with controlled current compliance. The current compliance regulates the power available for resistive switching. When more power is applied to crystalline RRAM, higher conductance states can be accessed, as shown in the left-hand side of FIG. 12. This could be due to more metal movement to percolate electron pathways through the space-charge region.

Analog conductance states could decay over time, as shown in the right-hand side of FIG. 10. Higher conductance states (programmed with more power) tended to show better retention than lower (weakly programmed) conductance states.

Example 4

This example shows how devices (e.g., memristors) may have multi-level stable conductance states.

Figure 11A:
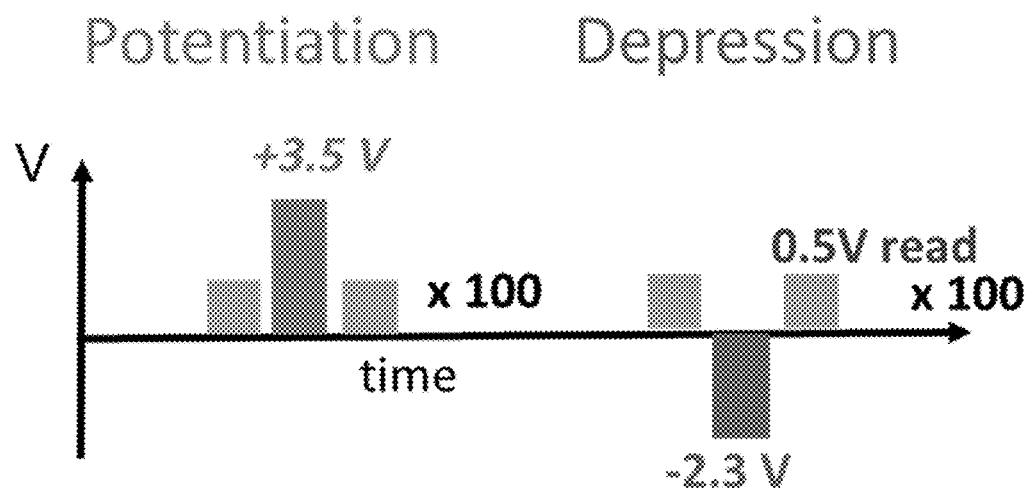
FIGS. 11A-11B depict voltage pulses updating conductance states, according to some embodiments.
Figure 11B:
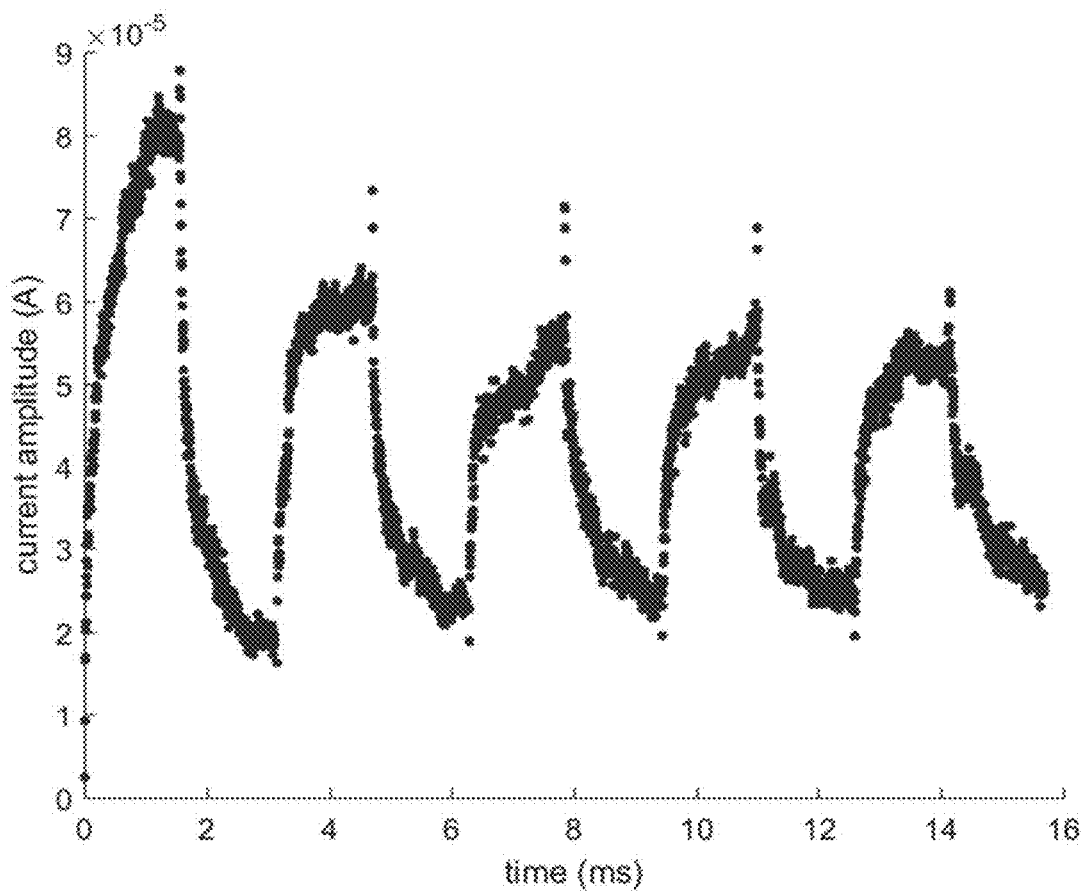

Transistor-regulated programming (with current compliance) can allow for multi-level analog potentiation and depression. Pulse programming without current-compliance is another voltage application strategy to access analog conductance states. Sparse electrical pulses also could be more energy efficient since voltage is only applied briefly. To analyze artificial synapse response to spiking pulses, potentiation-depression (P-D) measurements were conducted. An example pulse train for a P-D protocol is illustrated in FIG. 11A. Pulse duration on the order of 1 microsecond could reliably elicit conductance change response, as shown in FIG. 11B. Resistive switching with pulse duration on the order of 20 nanoseconds was also demonstrated with crystalline RRAM.

The voltage pulses may modify or update the conductance states, as shown in FIGS. 11A and 11B.

Example 5

This example describes the fabrication and use of LPCVD plasma-passivated polycrystalline RRAM devices.

Devices were fabricated in which doped poly-crystalline Si was grown on top of a thick dielectric ($SiO_2$) using low-pressure chemical vapor deposition. When the devices were actuated, however, resistive switching was not observed. It is believed that grain boundaries acted as stationary trap states. It is further believed that, because of this, electrons could easily bypass the space-charge region at the metal semiconductor interface. As a result, no resistive switching (typical resistor behavior) was observed for these poly-crystalline based films with untreated grain boundaries.

Figure 13:
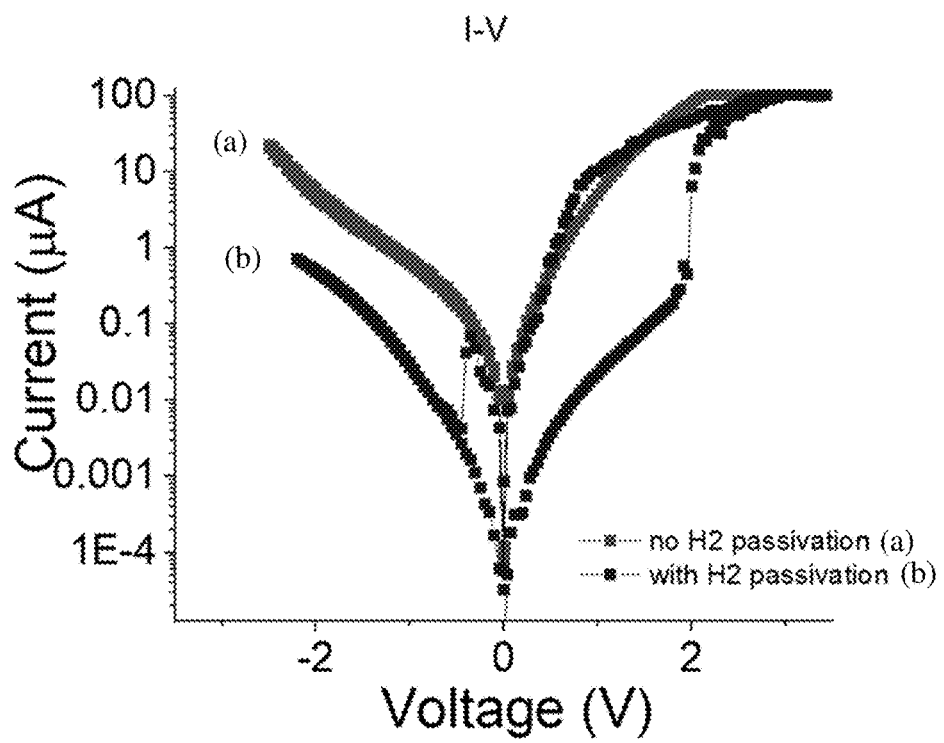
FIG. 13 is a plot of current vs. voltage for a hydrogen-passivated device, according to certain embodiments. It is believed that free bonds at grain boundaries can act as stationary trap states, which can result in no resistive switching for Ag/poly-crystalline p+ Si that have not been passivated. Hydrogen treatment can passivate free bonds to allow for resistive switching.

In another set of devices, grain boundary defects were passivated using hydrogen plasma to allow for resistive switching with LPCVD-grown boron doped poly-crystalline silicon. FIG. 13 is a plot of current vs. voltage for these passivated devices. FIG. 13 suggests that hydrogen can effectively occupy free bonds to allow for RRAM resistive switching in vertically stacked arrangements that use polycrystalline layers.

Figure 14:
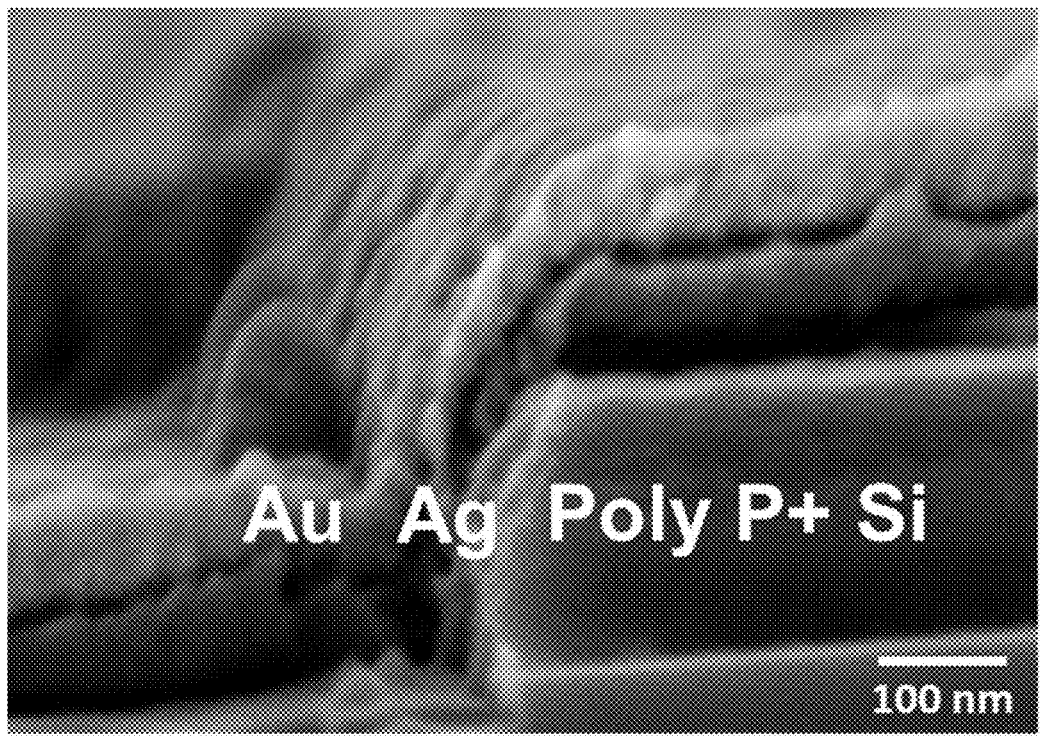
FIG. 14 is a scanning electron microscope (SEM) image of a sidewall device, according to certain embodiments. The SEM images shows the sidewall 3D RRAM device at an Ag/poly p+ Si interface.

Sidewall devices, one example of which is illustrated in FIG. 14, were also constructed and tested.

Figure 15:
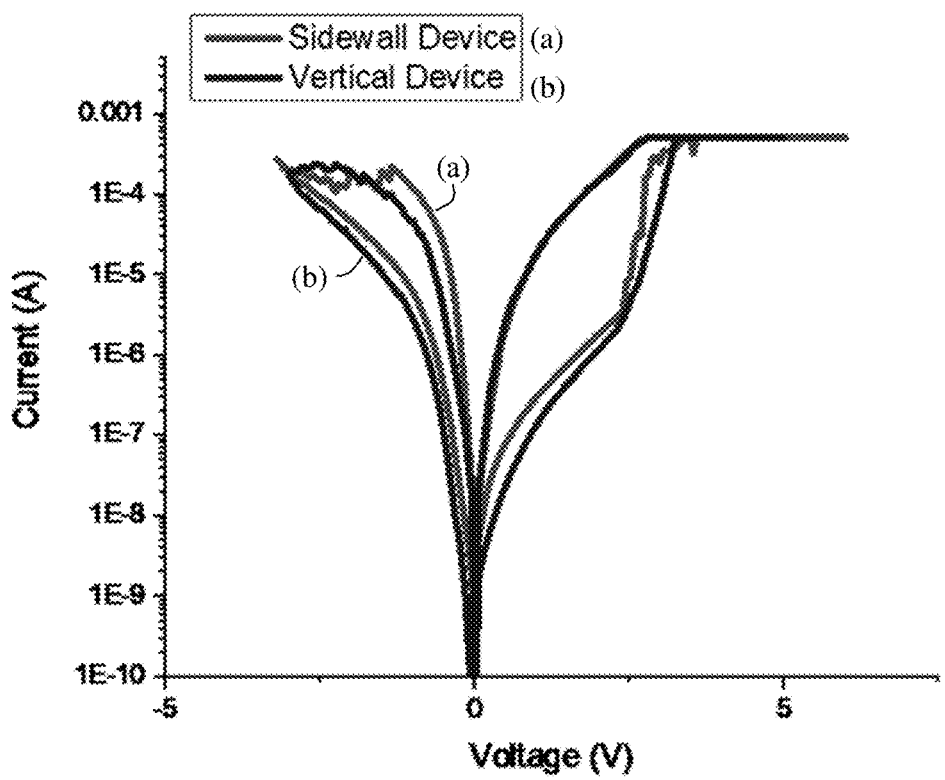
FIG. 15 is a plot of current vs. voltage for vertical and sidewall polycrystalline-based devices, according to certain embodiments. These I-V plots of vertical and sidewall devices reveal similar switching behavior for both device geometries.
Figure 16:
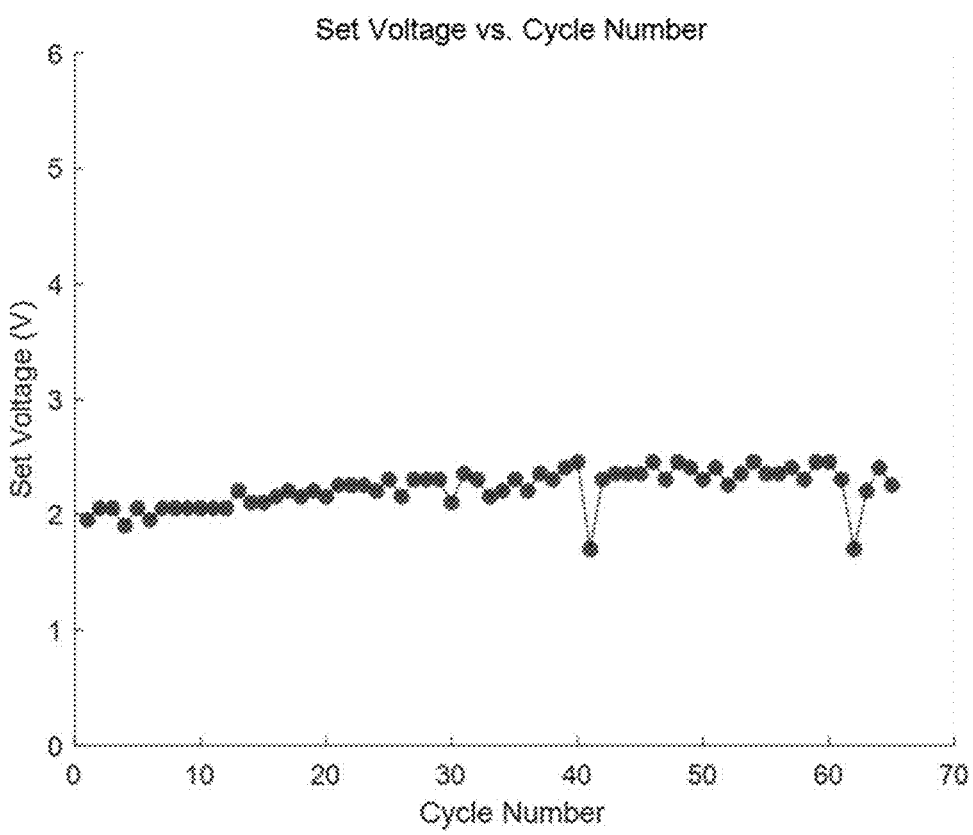
FIG. 16 is a plot of set voltage vs. cycle number for polycrystalline-based devices, according to some embodiments. An average set voltage of 2.23±0.017 V (8% variation) was observed.
Figure 17:
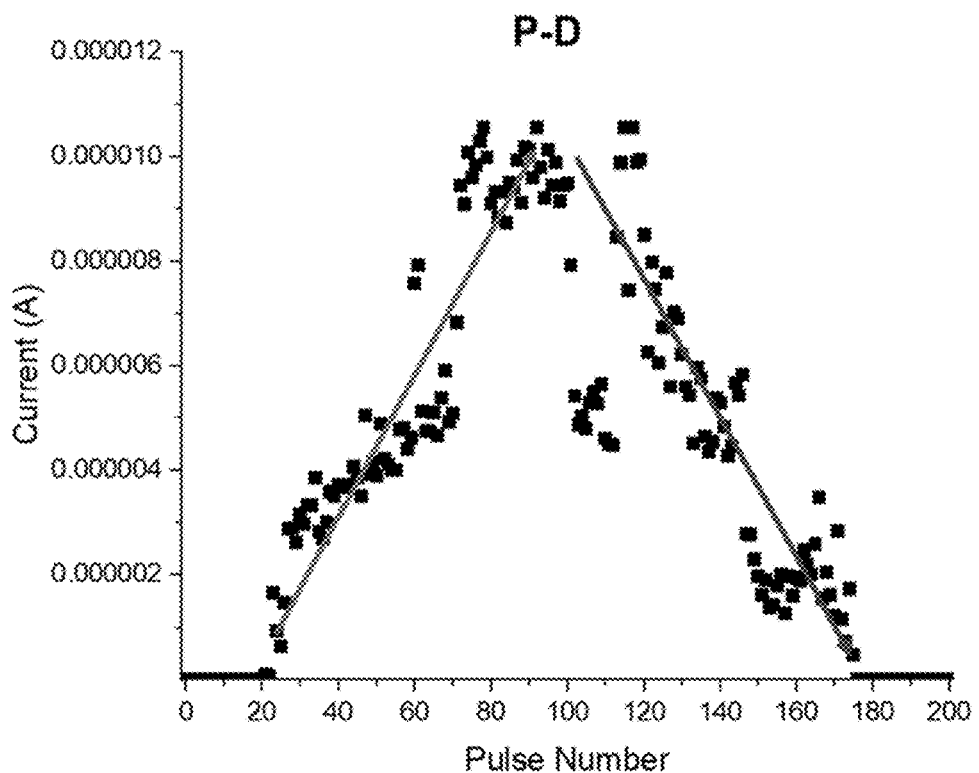
FIG. 17 is a plot of current vs. pulse number for polycrystalline-based devices, according to some embodiments. Potentiation and depression demonstrated analog update was possible from voltage pulse trains.
Figure 18:
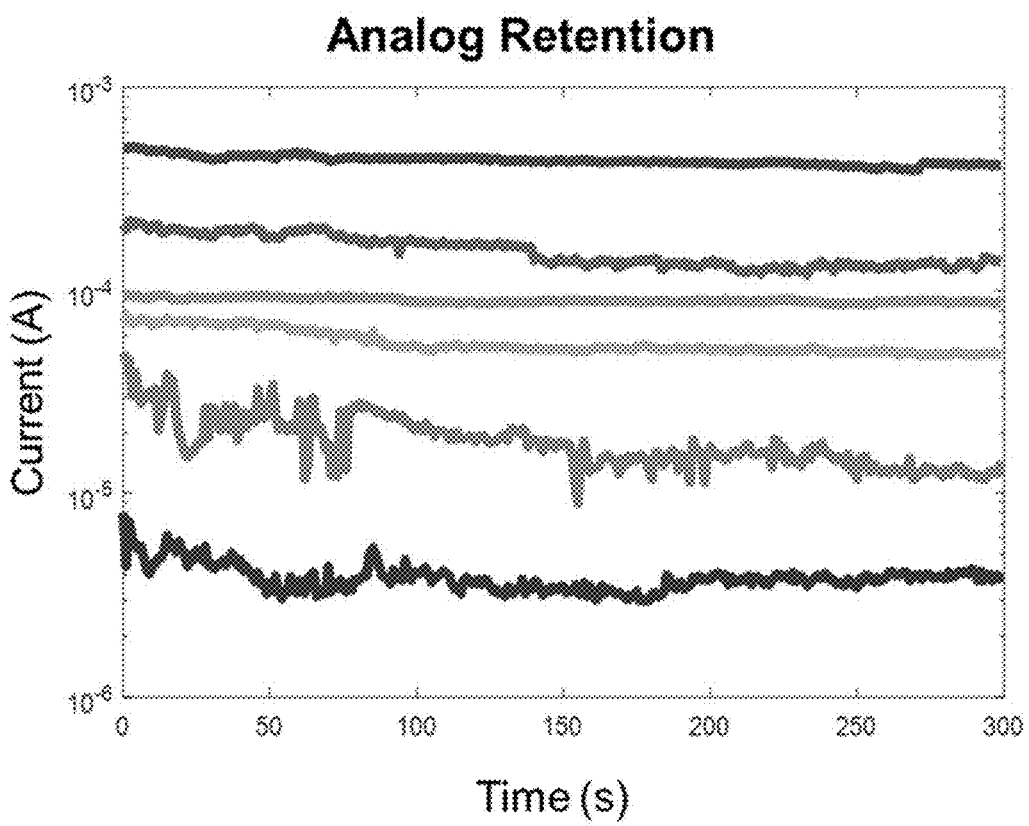
FIG. 18 is a plot showing analog retention of the polycrystalline-based devices, according to some embodiments. Up to six distinguishable states were demonstrated after 5 minutes.
Figure 19:
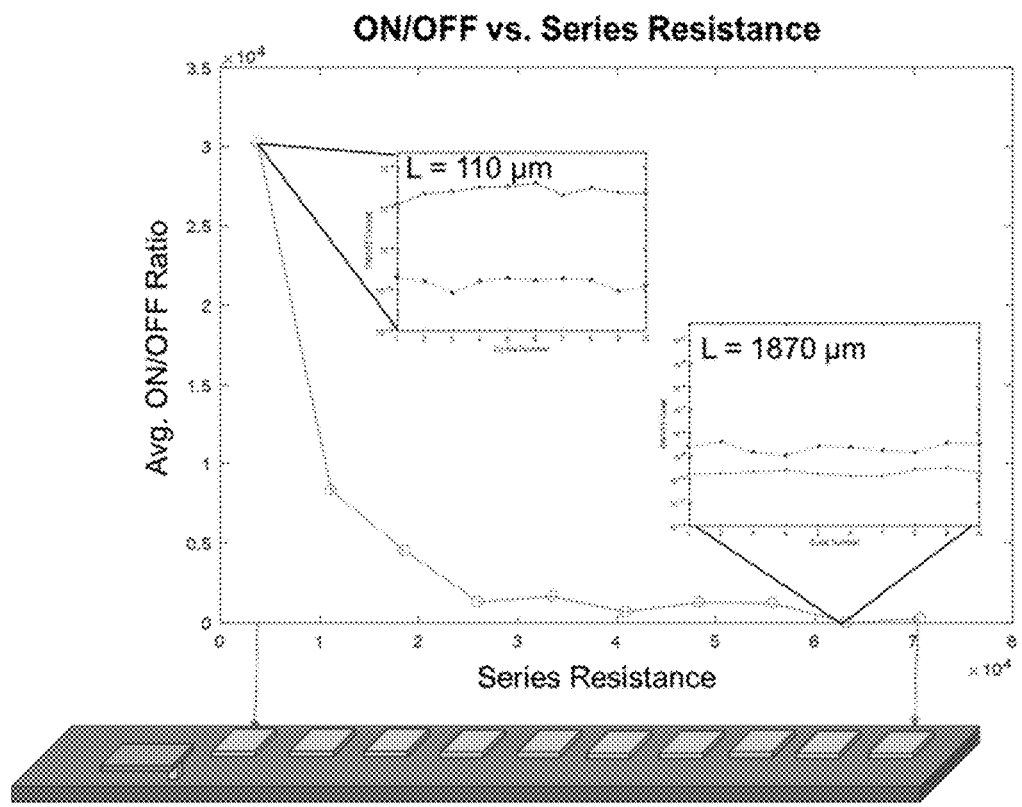
FIG. 19 shows ON/OFF ratios as a function of series resistance for polycrystalline-based devices, according to some embodiments. The average ON/OFF ratio of the same device was measured with increasing series resistance by increasing the distance from the inactive metal pad. ON/OFF was measured at 0.3V.

Vertical and sidewall devices both demonstrated similar I-V characteristics, as shown in FIG. 15. Temporal set voltage variation was as low as 8%, as shown in FIG. 16. Linear potentiation and depression were also possible to achieve with these devices, as shown in FIG. 17. As many as six analog conductance states could be held in these devices, as shown in FIG. 18. The effect of series resistance on resistive switching was studied by increasing the distance of the inactive metal contact from the polycrystalline layer under measurement. FIG. 19 shows the average ON/OFF of the devices with increasing series resistance measured at 0.3 V. Increasing the series resistance reduced the ON/OFF ratio. As the distance from the active metal increased, series resistance increased, which reduced both the ON and the OFF current. The ON current was reduced at a more drastic rate since the voltage drop across the active interface decreased as series resistance increases. Weaker programming power delivered to the device resulted in less active metal movement, which manifested as lower ON conductance.

Figure 20:
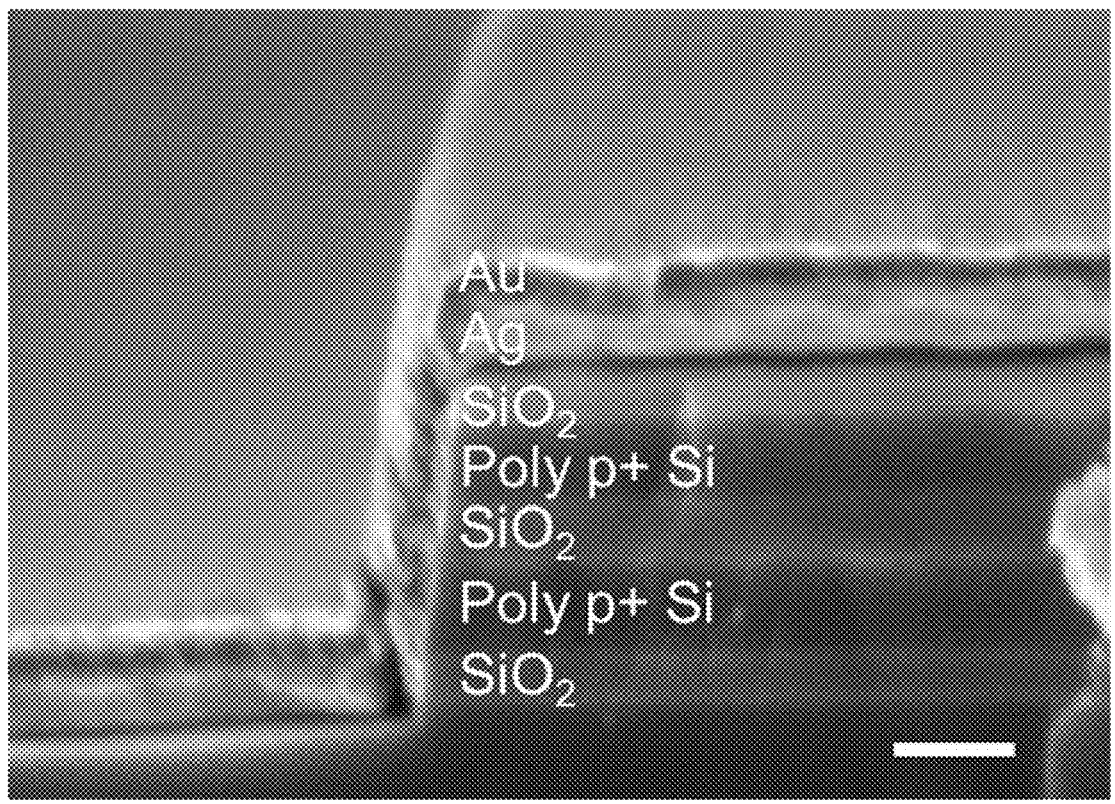
FIG. 20 is an SEM image of a two-layer polycrystalline-based device, according to some embodiments. The SEM shows that two polycrystalline layers can be isolated by $SiO_2$. Scale bar: 200 nm.
Figure 21:
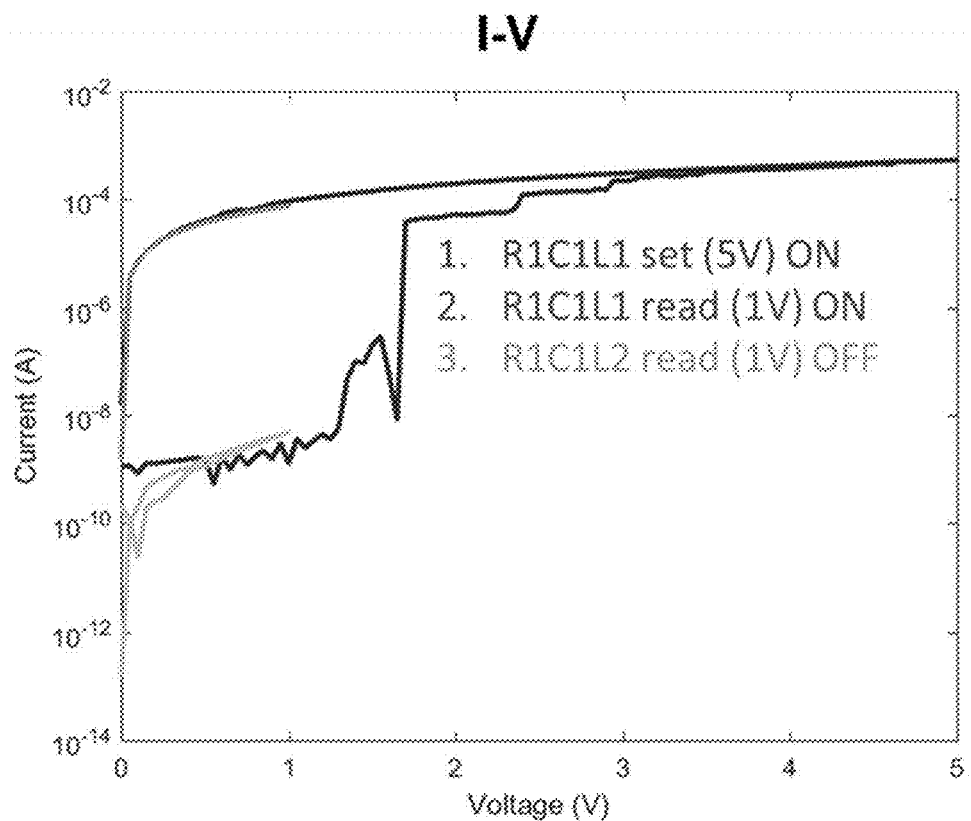
FIG. 21 is a plot of current vs. voltage for an isolated polycrystalline-based device, according to certain embodiments. The device in row 1, column 1, layer 1 (R1C1L1) is programmed ON. A read measurement of R1C1L1 shows that this device remained ON after programming. PolyRAM device in row 1, column 1, layer 2 (R1C1L2) is read OFF while R1C1L1 is programmed ON, demonstrating that layer 1 and layer 2 are electrically isolated.

Polycrystalline layer-based devices can be stacked vertically, as shown in FIG. 20. When artificial synapses were vertically stacked, layer isolation was important; otherwise, multiple layers may behave as a single device. Layer isolation for a two-layer polycrystalline device is demonstrated in the I-V shown in FIG. 21. The dielectric $SiO_2$ layer separating poly-crystalline p+ Si layers were 100 nm thick and $SiO_2$ was also used to passivate array sidewalls outside the active area. Although the polycrystalline artificial synapse in the first layer is programmed ON, the polyRAM artificial synapse in the second layer can still be read as OFF, demonstrating successful device isolation.

Example 6

This example describes the fabrication and use of hydrogenated microcrystalline polycrystalline RRAM devices.

Although the LPCVD-grown devices demonstrated promising performance, growth occurs above 600° C., which may be not be suitable for all applications. For example, such growth temperatures could degrade underlying CMOS components in peripheral circuitry. Hydrogenated micro-crystalline polycrystalline Si doped with boron can be grown at lower temperatures using PECVD (e.g., as a material traditionally used for solar cells). Micro-crystalline random-access memory (microRAM) can be fabricated at low temperature using this material.

Figure 22:
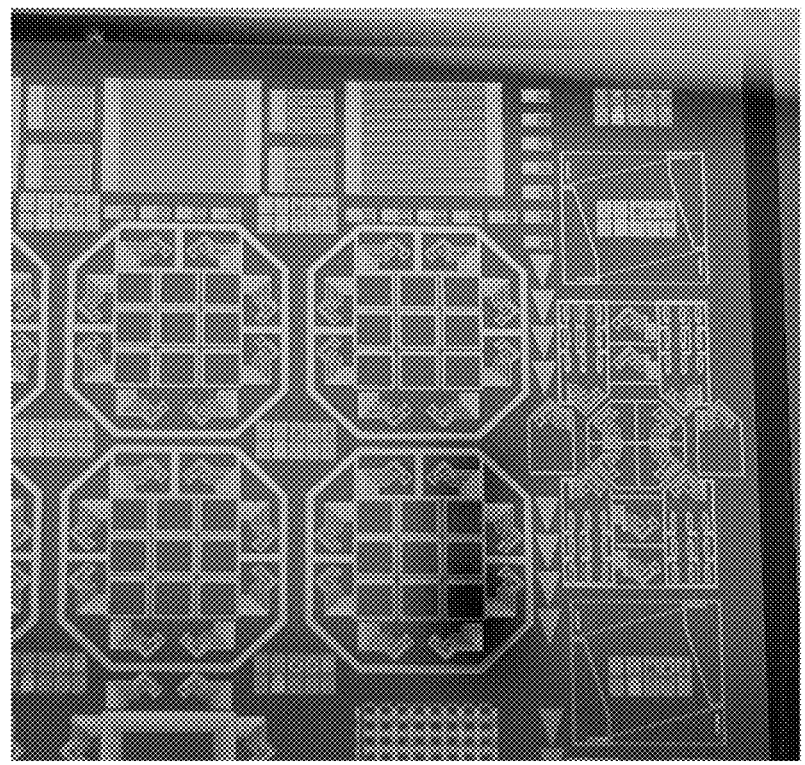
FIG. 22 is an optical image of a 3D microRAM array, in accordance with certain embodiments. The image shows various 5-layer 3D microRAM arrays on a test chip.
Figure 23:
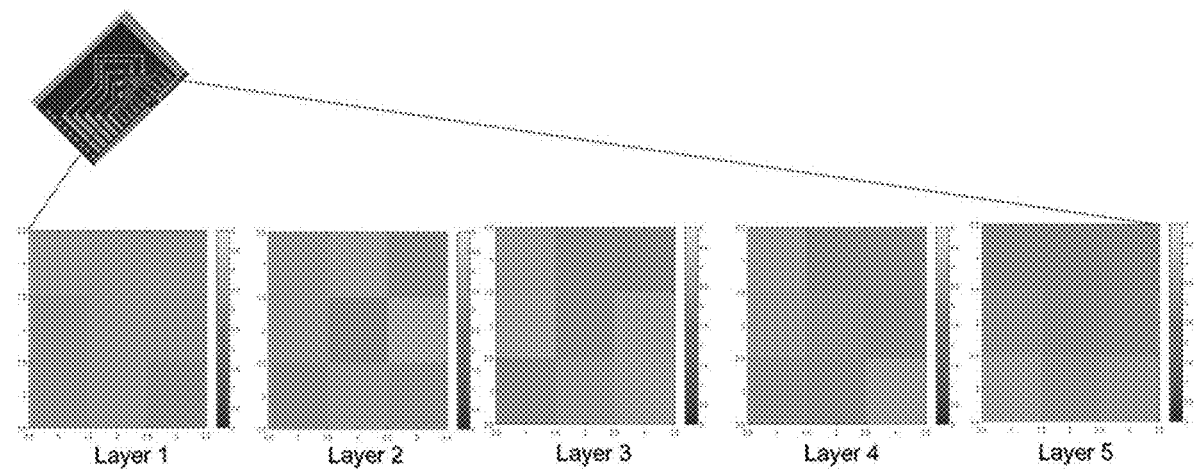
FIG. 23 is a color map of average set voltage for a 3×3×5 microRAM array, according to certain embodiments. The spatial average set voltage was 3.07 0.22 V (7% spatial variation).
Figure 24:
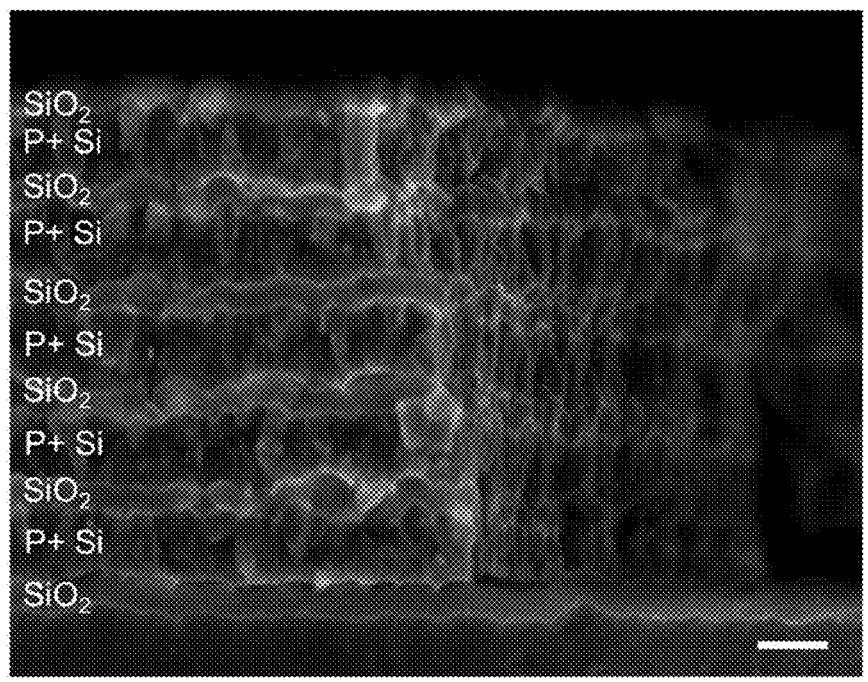
FIG. 24 is an SEM image of a five-layer microRAM, according to certain embodiments. The SEM reveals five hydrogenated microcrystalline p+ Si layers isolated by $SiO_2$ deposited by PECVD. Scale bar: 200 nm.

MicroRAM 3D arrays with five active layers are shown in FIG. 22. Devices on a 3×3×5 computing core demonstrated 7% average set voltage spatial variation, as shown in FIG. 23. An SEM of a five-layer microRAM stack is shown in FIG. 24.

Figure 25:
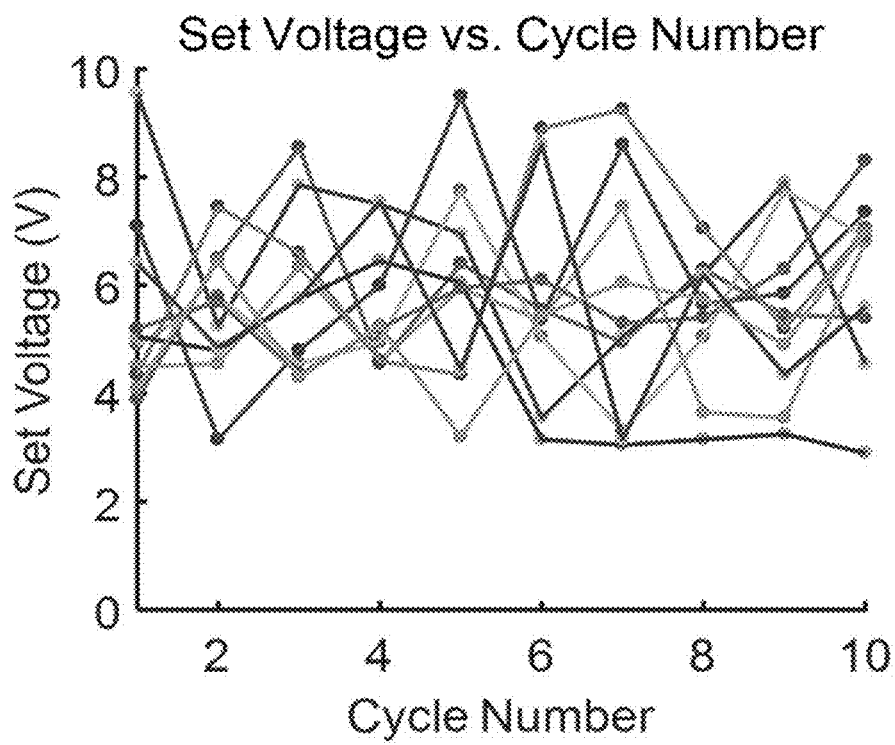
FIG. 25 is a plot of set voltage as a function of cycle number for 10 lowly-doped microRAM devices over 10 cycles, showing large variations.
Figure 26:
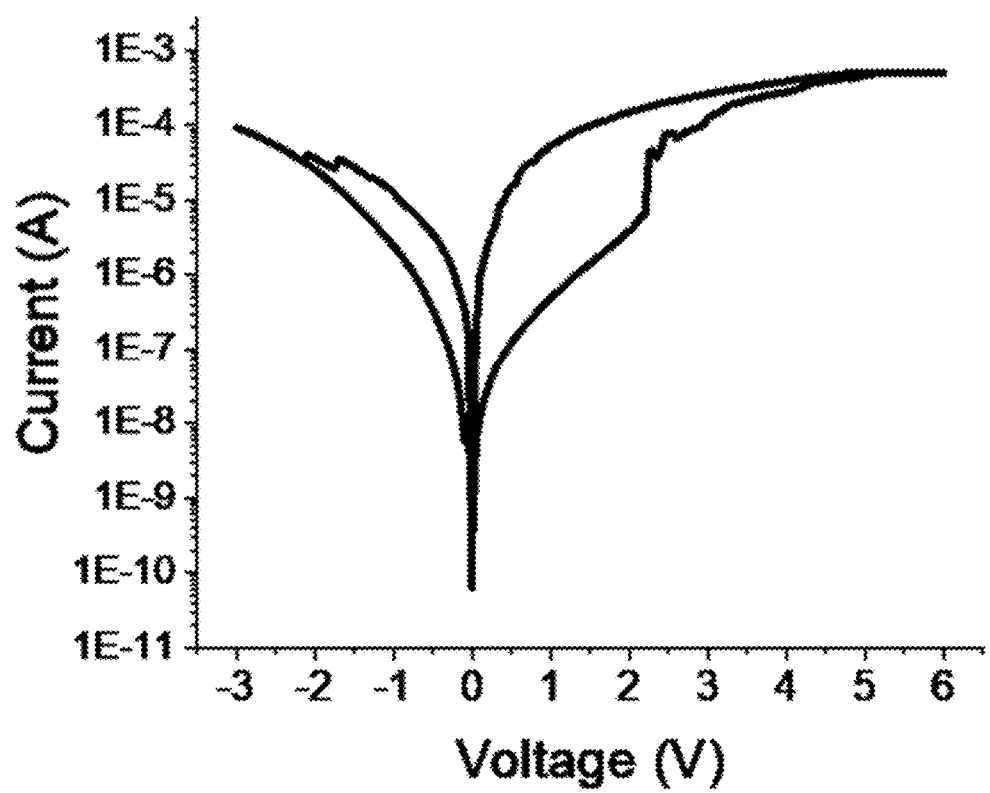
FIG. 26 is a plot of current vs. voltage for a highly-doped microRAM device, in accordance with certain embodiments. The plot shows that good resistive switching was achieved.
Figure 27:
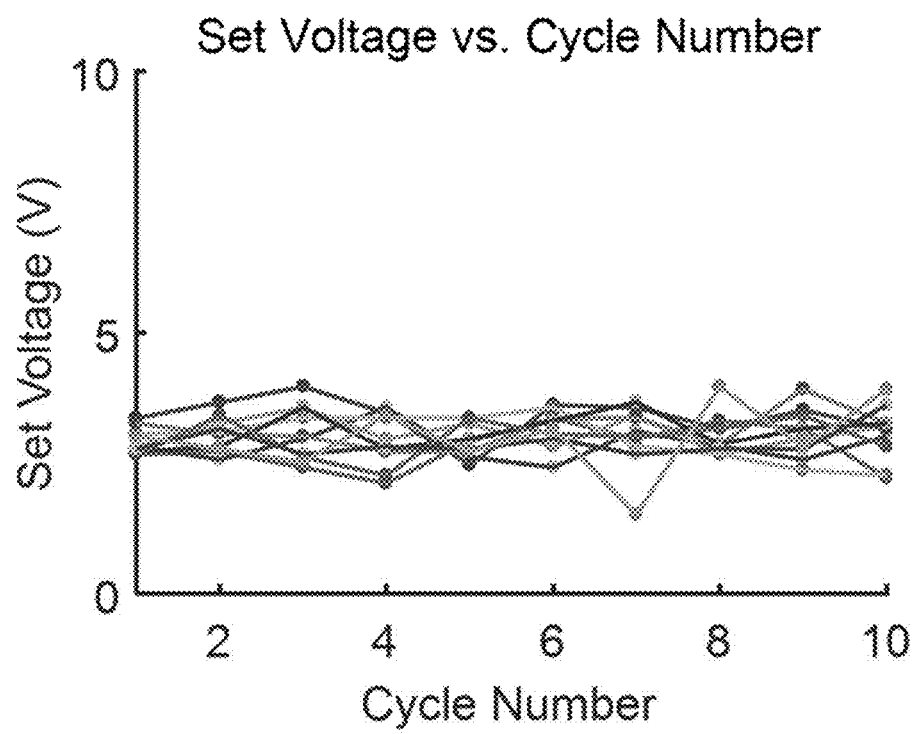
FIG. 27 is a plot of set voltage as a function of cycle number for 10 highly-doped microRAM devices over 10 cycles, showing an average set voltage of 3.18 V (6% spatial variation). Set voltage is defined as the voltage at which the steepest I-V gradient occurs.

Doping concentration impacted the performance of the microRAM devices. FIG. 25 shows the SET voltage vs. cycle number for 10 microRAM devices with low doping concentration. MicroRAM with low doping concentration showed 11% spatial variation. This could be due to the high series resistance from the micro-crystalline layer. In contrast, high doping concentration resulted in more uniform resistive switching. FIG. 26 shows the I-V response from highly-doped microRAM and FIG. 27 shows the SET voltage vs. cycle number for 10 microRAM devices. By increasing the doping concentration of the micro-crystalline film, spatial set voltage variation was reduced to 6%.

Figure 28:
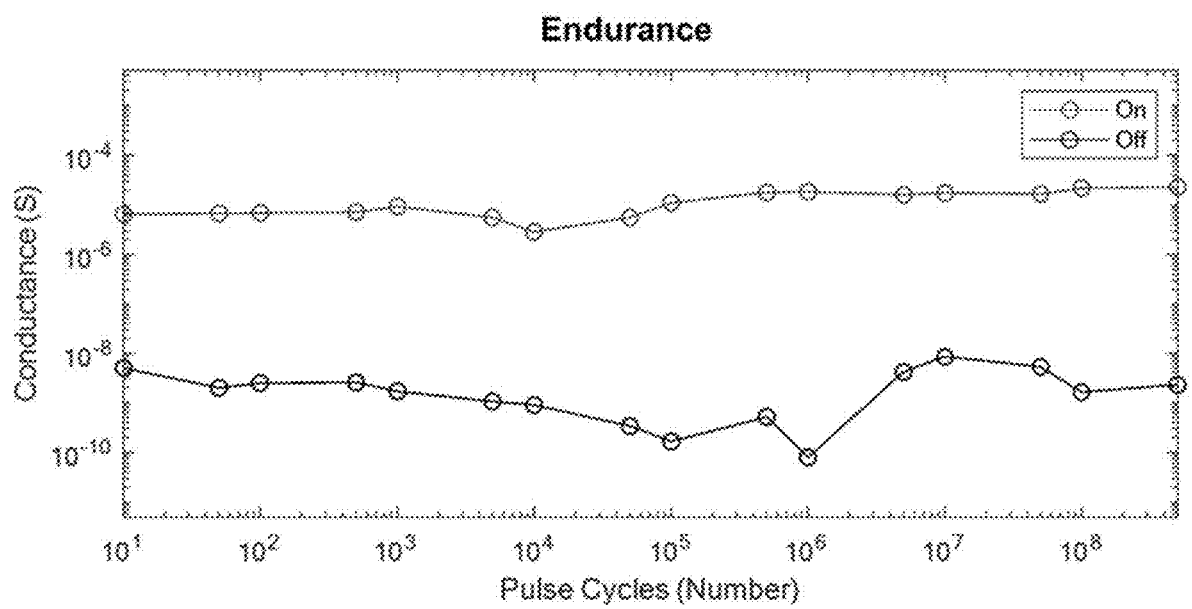
FIG. 28 is a plot of conductance as a function of the number of pulse cycles, showing the endurance of a microRAM device, according to certain embodiments.

The endurance of a microRAM device is shown in FIG. 28. This pulsed voltage stresses (PVS) test was performed under a square pulse condition (non-sinusoidal periodic waveform) on small device cells (25 square micrometers). Each pulse cycle consisted of a potentiation process and a depression process. While potentiation was carried out with 100 pulses of 4 V amplitude and 50 ms duration, depression was conducted with 100 pulses of −3 V amplitude and 50 ms duration. Data points of ON (top row of dots) and OFF (bottom row of dots) states were collected at DC cycles after pulse programming cycles with a read voltage of 0.2 V. The MicroRAM device maintained a high ON/OFF ratio, even after more than $10^{11}$ pulses. In fact, during the PVS test, the device achieved an ON/OFF ratio of greater than 100, which is substantially higher than 5 (which would be considered a device failure). For these tests, the DC condition was set at 6 V, with a reset at −4 V, and a compliance current of 10 mA.

Figure 29:
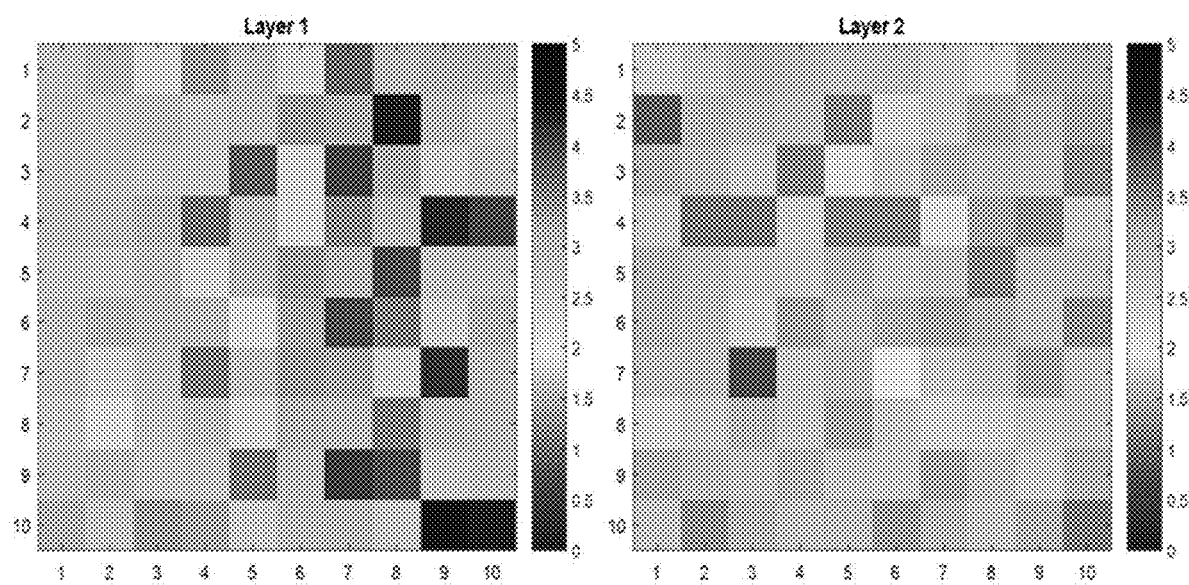
FIG. 29 is a color map of average set voltages for a 10×10×2 microRAM array with 100 nm thick hydrogenated micro-crystalline p+Si layers, in accordance with certain embodiments. This color map shows a 4% spatial set voltage variation.
Figure 30:
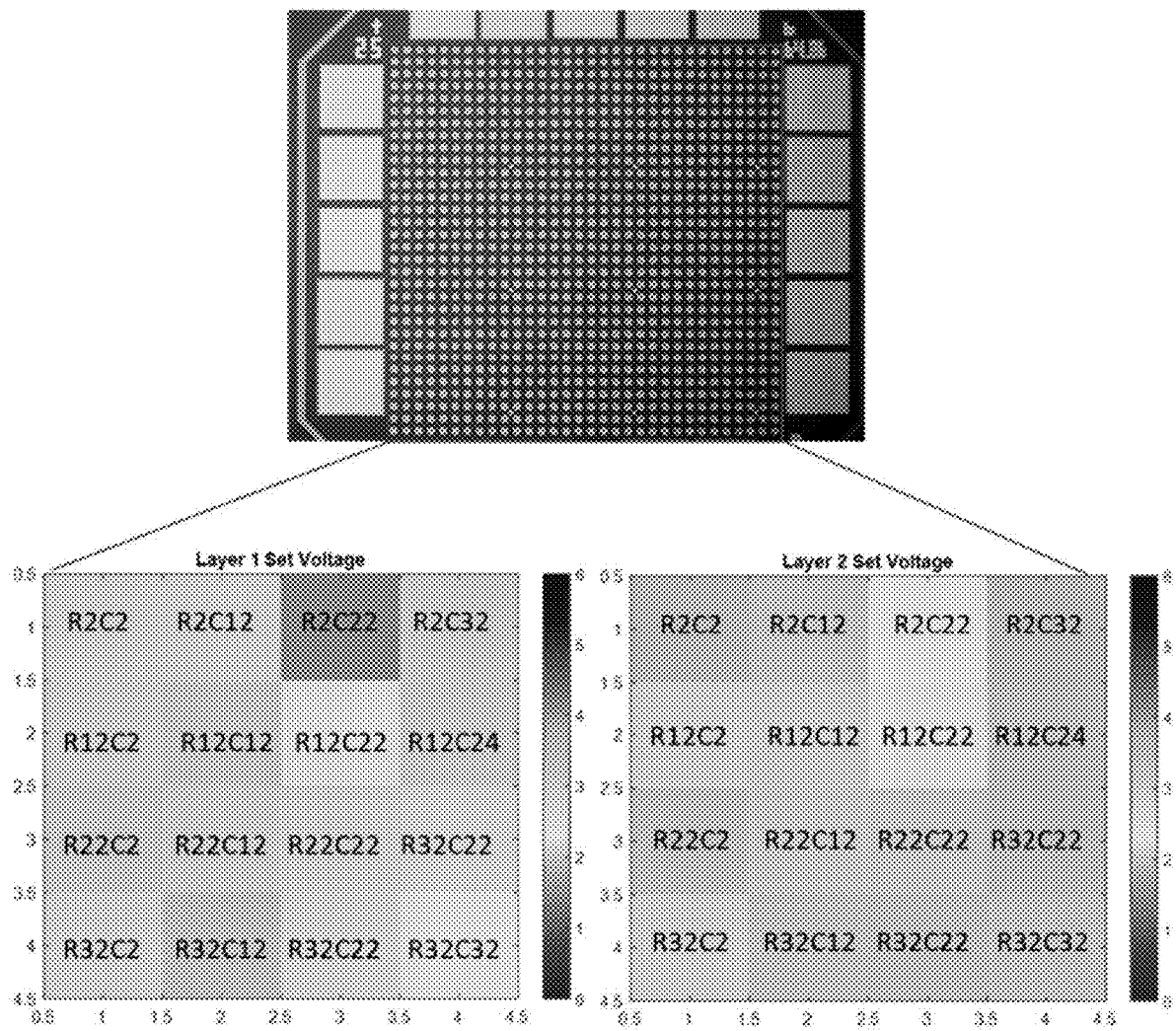
FIG. 30 is a color map of average set voltage for a 32×32×2 microRAM array with 100 nm thick hydrogenated micro-crystalline p+Si layers, in accordance with certain embodiments. This color map shows a 7% spatial variation for every 10 devices measured.

MicroRAM devices containing 100-nm thick layers can scale up to 10×10×2 with 4% spatial variation, as shown in FIG. 29. Thicker microRAM layers allow for larger scaling. MicroRAM containing 200-nm thick layers can scale up to 32×32×2 with 7% spatial variation, as shown in FIG. 30.

Table 1 compares switching parameters for polyRAM (Example 5) and microRAM (Example 6) devices at a read voltage of 1 V.

TABLE 1

Table of switching parameters showing polyRAM and microRAM characteristics. Read voltage: 1 V.

|  | Ag/poly-p + Si | Ag/micro-p + Si |
|---|---|---|
| Avg. $V_{SET}$ (V) | 2.15 | 3.13 |
| Avg. $I_{ON}$ (A) | 3.76E−05 | 8.40E−06 |
| Avg. $I_{OFF}$ (A) | 2.24E−07 | 3.00E−08 |
| Avg. ON/OFF | 168 | 280 |
| Spatial variation | 0.11 | 0.07 |
| Temporal variation | 0.08 | 0.19 |

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A device for electrical switching, the device comprising:
   a crystalline layer;
   a first electrode disposed proximate to the crystalline layer; and
   a second electrode disposed proximate to the crystalline layer,
   wherein the first electrode comprises an active material from which at least one metallic species is transferred into interstices of a crystal lattice of the crystalline layer upon application of a first voltage across the first electrode and the second electrode, such that the resistance of the crystalline layer is altered.

2. The device of claim 1, wherein the first electrode has a first solid solubility less than 1% in the crystalline layer.

3. The device of claim 1, wherein the second electrode has a second solid solubility less than 1% in the crystalline layer.

4. The device of claim 1, wherein the at least one metallic species is in ionic or non-ionic form.

5. The device of claim 1, wherein the first electrode and the crystalline layer are within 50 nm of each other.

6. The device of claim 1, wherein the first electrode is in direct contact with the crystalline layer.

7. The device of claim 1, wherein the crystalline layer comprises a semiconductor.

8. The device of claim 7, wherein the semiconductor further comprises a dopant.

9. The device of claim 8, wherein the dopant modulates a dimension of a Schottky barrier within the device such that a percolating conductive pathway is formed.

10. The device of claim 7, wherein the dopant modulates a trap state within the device such that a percolating conductive pathway is formed.

11. The device of claim 7, wherein the semiconductor comprises a group IV semiconductor, a group III-V semiconductor, a group III-nitride semiconductor, and/or a group II-VI semiconductor.

12. The device of claim 1, wherein the active material of the first electrode is not present as a dopant in the crystalline layer prior to application of the voltage.

13. The device of claim 1, wherein the crystalline layer has a thickness of 2 nm to 1 μm.

14. The device of claim 1, wherein the at least one metallic species remains in ionic form after the resistance of the crystalline layer is altered.

15. The device of claim 1, wherein the at least one metallic species dopes the crystalline layer such that the resistance of the crystalline layer is altered.

16. The device of claim 1, wherein a density of line defects within the crystalline layer is less than 100 line defects per square micron.

17. The device of claim 1, wherein the crystalline layer is substantially free of line defects.

18. A device for electrical switching, the device comprising:
   a single crystalline layer;
   a first electrode disposed proximate to the single crystalline layer; and
   a second electrode disposed proximate to the single crystalline layer,
   wherein the first electrode comprises a material from which at least one metallic species is transferred into the single crystalline layer upon application of a first voltage across the first electrode and the second electrode, such that the resistance of the single crystalline layer is altered.

19. The device of claim 18, wherein the first electrode comprises a material from which at least one metallic species is transferred into interstices of a crystal lattice of the crystalline layer upon application of a first voltage across the first electrode and the second electrode, such that the resistance of the crystalline layer is altered.

20. A device for electrical switching, the device comprising:
   a polycrystalline layer comprising passivated grain boundaries;
   a first electrode disposed proximate to the polycrystalline layer; and
   a second electrode disposed proximate to the polycrystalline layer,
   wherein the first electrode comprises a material from which at least one metallic species is transferred into the polycrystalline layer upon application of a first voltage across the first electrode and the second electrode, such that the resistance of the polycrystalline layer is altered.

21. A method of actuating a device comprising a crystalline layer, a first electrode comprising an active material, and a second electrode, the method comprising:
   applying a first voltage, having a first sign, across the first electrode and the second electrode, the first voltage causing a plurality of metallic species of the active material to be transferred into interstices of a crystal lattice of the crystalline layer, such that a resistance of the crystalline layer is altered.

22. A method of actuating a device comprising a single crystalline layer, a first electrode comprising a material, and a second electrode, the method comprising:
   applying a first voltage, having a first sign, across the first electrode and the second electrode, the first voltage causing a plurality of metallic species of the material to be transferred into the single crystalline layer, such that a resistance of the single crystalline layer is altered.

23. A method of actuating a device comprising a polycrystalline layer comprising passivated grain boundaries, a first electrode comprising a material, and a second electrode, the method comprising:
   applying a first voltage, having a first sign, across the first electrode and the second electrode, the first voltage causing a plurality of metallic species of the material to be transferred into the polycrystalline layer, such that a resistance of the polycrystalline layer is altered.

24. A method of fabricating an electrical switching device, the method comprising:
   arranging a crystalline layer, a first electrode, and a second electrode such that the first electrode is disposed proximate to the crystalline layer and the second electrode is disposed proximate to the crystalline layer,
   wherein the first electrode comprises an active material from which at least one metallic species is transferred into interstices of a crystal lattice of the crystalline layer upon application of a first voltage across the first electrode and the second electrode, such that the resistance of the crystalline layer is altered.

25. A method of fabricating an electrical switching device, the method comprising:
   arranging a single crystalline layer, a first electrode, and a second electrode such that the first electrode is disposed proximate to the single crystalline layer and the second electrode is disposed proximate to the single crystalline layer,
   wherein the first electrode comprises a material from which at least one metallic species is transferred into the single crystalline layer upon application of a first voltage across the first electrode and the second electrode, such that the resistance of the single crystalline layer is altered.

26. A method of fabricating an electrical switching device, the method comprising:

arranging a single crystalline layer, a first electrode, and a second electrode such that the first electrode is disposed proximate to the single crystalline layer and the second electrode is disposed proximate to the single crystalline layer, wherein the first electrode comprises a material from which at least one metallic species is transferred into the single crystalline layer upon application of a first voltage across the first electrode and the second electrode, such that the resistance of the single crystalline layer is altered.

* * * * *